United States Patent
Li et al.

(10) Patent No.: US 11,521,539 B2
(45) Date of Patent: Dec. 6, 2022

(54) SCANNING DRIVE CIRCUIT INCLUDING N SHIFT REGISTERS EACH HAVING INDEPENDENT OUTPUT TERMINALS, DRIVING METHOD, DISPLAY PANEL, AND DISPLAY APPARATUS

(71) Applicants: WUHAN TIANMA MICROELECTRONICS CO., LTD., WUHAN (CN); WUHAN TIANMA MICROELECTRONICS CO., LTD. SHANGHAI BRANCH, Shanghai (CN)

(72) Inventors: Yue Li, Shanghai (CN); Mengmeng Zhang, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 17/394,954

(22) Filed: Aug. 5, 2021

(65) Prior Publication Data
US 2021/0366358 A1    Nov. 25, 2021

(30) Foreign Application Priority Data
May 14, 2021    (CN) .......................... 202110525969.0

(51) Int. Cl.
G11C 19/28    (2006.01)
G09G 3/20    (2006.01)
G09G 3/3266    (2016.01)

(52) U.S. Cl.
CPC ............ *G09G 3/2092* (2013.01); *G11C 19/28* (2013.01); *G09G 3/20* (2013.01); *G09G 3/3266* (2013.01);

(Continued)

(58) Field of Classification Search
CPC ...... G09G 3/2092; G09G 3/20; G09G 3/3266; G09G 2310/0267; G09G 2310/0283; G09G 2310/0286; G11C 19/28
See application file for complete search history.

(56) References Cited

U.S. PATENT DOCUMENTS

| | | | |
|---|---|---|---|
| 2012/0050234 A1* | 3/2012 | Jang ..................... | G09G 3/3225 345/204 |
| 2014/0111490 A1* | 4/2014 | Lee ........................ | G11C 19/28 345/204 |

(Continued)

FOREIGN PATENT DOCUMENTS

CN    110364121 A    * 10/2019    ........... G09G 3/3266

*Primary Examiner* — Adam J Snyder
(74) *Attorney, Agent, or Firm* — Christensen O'Connor Johnson Kindness PLLC

(57) ABSTRACT

A scanning drive circuit, a driving method, a display panel, and a display apparatus are provided. The scanning drive circuit includes $1^{st}$ to $n^{th}$ shift registers cascaded sequentially. Each shift register includes a pull-down unit, a pull-up unit, and first and second output units. The first output unit is electrically connected to a second supply voltage terminal and a first clock signal output terminal, and configured to output a level to a first output terminal based on levels of a second node and a third node. The second output unit is electrically connected to a third supply voltage terminal and a second clock signal output terminal, and configured to output a level to a second output terminal based on the levels of the second node and a fourth node. The first and the second output terminals of each shift register output effective levels sequentially.

19 Claims, 24 Drawing Sheets

(52) U.S. Cl.
CPC .............. *G09G 2310/0267* (2013.01); *G09G 2310/0283* (2013.01); *G09G 2310/0286* (2013.01)

(56) References Cited

U.S. PATENT DOCUMENTS

2016/0189586 A1\* 6/2016 Zou ...................... G09G 3/3266
345/213
2017/0084222 A1\* 3/2017 Sun .......................... G09G 3/32

\* cited by examiner t2 t4 t5 t6 t3' t6'

SCANNING DRIVE CIRCUIT INCLUDING N SHIFT REGISTERS EACH HAVING INDEPENDENT OUTPUT TERMINALS, DRIVING METHOD, DISPLAY PANEL, AND DISPLAY APPARATUS

CROSS-REFERENCE TO RELATED APPLICATIONS

The present application claims priority to Chinese Patent Application No. 202110525969.0, filed on May 14, 2021, the content of which is incorporated herein by reference in its entirety.

TECHNICAL FIELD

The present disclosure relates to the field of display technologies, and in particular, to a scanning drive circuit, a driving method, a display panel, and a display apparatus.

BACKGROUND

Display apparatuses such as smart watches can only realize screen scanning and refreshing in a certain direction in a display process. However, as the display apparatuses are applied more widely, there is a need to switch a screen scanning and refreshing direction. For example, when wearing a smart watch, a user does not need to consider a forward direction. If the user wears the smart watch in a wrong direction, a direction of a screen can be switched by switching the screen scanning and refreshing direction. However, to realize different screen scanning and refreshing directions, more scanning drive circuits can be provided, and the scanning drive circuits occupy relatively large space, which does not facilitate design of a narrow bezel.

SUMMARY

According to a first aspect, an embodiment of the present disclosure provides a scanning drive circuit, and the scanning drive circuit includes n shift registers. The n shift registers include $1^{st}$ shift register to $n^{th}$ shift register that are cascaded sequentially. Each of the n shift registers includes an input node, a first node, a second node, a third node, a fourth node, a first output terminal, a second output terminal, a pull-down unit, a pull-up unit, a first output unit, and a second output unit. The first node is electrically connected to the third node, and the third node is electrically connected to the fourth node. The pull-down unit is electrically connected to the first node and the input node, and is configured to provide a level to the first node under control of a first clock signal and a second clock signal. The pull-up unit is electrically connected to the second node and a first supply voltage terminal, and is configured to provide a level to the second node under control of the first clock signal. The first output unit is electrically connected to a second supply voltage terminal and a first clock signal output terminal, and is configured to output a level to the first output terminal based on a level of the second node and a level of the third node. The second output unit is electrically connected to a third supply voltage terminal and a second clock signal output terminal, and is configured to output a level to the second output terminal based on the level of the second node and a level of the fourth node. In one scanning cycle of the scanning drive circuit, the first output terminal and the second output terminal of each of the n shift registers output an effective level sequentially.

According to a second aspect, an embodiment of the present disclosure provides a driving method for the above scanning drive circuit. The scanning drive circuit is configured to operate at a forward scanning stage or a reverse scanning stage. In each scanning cycle of the forward scanning stage, first output terminals of the $1^{st}$ shift register to the $n^{th}$ shift register output effective levels sequentially in an order of 1 to n, and the first output terminal and the second output terminal of each stage of the n shift registers output effective levels sequentially. In each scanning cycle of the reverse scanning stage, the first output terminals of the n shift registers output effective levels sequentially in an order of n to 1, and the first output terminal and the second output terminal of each of the n shift registers output effective levels successively.

According to a third aspect, an embodiment of the present disclosure provides a driving method for a scanning drive circuit. The scanning drive circuit includes n shift registers, a first clock signal line, a second clock signal line, a third clock signal line, a first clock signal output line, a second clock signal output line, a third clock signal output line, a fourth clock signal output line, a fifth clock signal output line, a sixth clock signal output line, a first scanning direction signal line, and a second scanning direction signal line. The n shift registers include $1^{st}$ shift register to $n^{th}$ shift register that are cascaded sequentially. Each of the n shift registers includes an input node, a first node, a second node, a third node, a fourth node, a first output terminal, a second output terminal, a pull-down unit, a pull-up unit, a first output unit, a second output unit, a first clock signal terminal, a second clock signal terminal, and a third clock signal terminal. The first node is electrically connected to the third node, and the third node is electrically connected to the fourth node. The pull-down unit is electrically connected to the first node and the input node, and is controlled by a first clock signal and a second clock signal to provide a level to the first node. The pull-up unit is electrically connected to the second node and a first supply voltage terminal, and is controlled by the first clock signal to provide a level to the second node. The first output unit is electrically connected to a second supply voltage terminal and a first clock signal output terminal, and outputs a level to the first output terminal based on a level of the second node and a level of the third node. The second output unit is electrically connected to a third supply voltage terminal and a second clock signal output terminal, and outputs a level to the second output terminal based on the level of the second node and a level of the fourth node. In one scanning cycle of the scanning drive circuit, the first output terminal and the second output terminal of each of the n shift registers output an effective level sequentially. The first clock signal terminal is configured to provide the first clock signal, the second clock signal terminal is configured to provide the second clock signal, and the third clock signal terminal is configured to provide a third clock signal. In a $(3i-2)^{th}$ shift register of the n shift registers, the first clock signal terminal is electrically connected to the first clock signal line, the second clock signal terminal is electrically connected to the second clock signal line, the third clock signal terminal is electrically connected to the third clock signal line, the first clock signal output terminal is electrically connected to the first clock signal output line, and the second clock signal output terminal is electrically connected to the second clock signal output line. In a $(3i-1)^{th}$ shift register of the n shift registers, the first clock signal terminal is electrically connected to the second clock signal line, the second clock signal terminal is electrically connected to the third clock signal line, the third clock signal terminal is electrically connected to the first clock signal line, the first clock signal output terminal is electrically connected to the third clock signal output line, and the second clock signal output terminal is electrically connected to the fourth clock signal output line. In a $3i^{th}$ shift register of the n shift registers, the first clock signal terminal is electrically connected to the third clock signal line, the second clock signal terminal is electrically connected to the first clock signal line, the third clock signal terminal is electrically connected to the second clock signal line, the first clock signal output terminal is electrically connected to the fifth clock signal output line, and the second clock signal output terminal is electrically connected to the sixth clock signal output line, wherein i=1, 2, 3, . . . , and n. In each of the n shift registers, the first scanning direction control signal terminal is electrically connected to the first scanning direction signal line, and the second scanning direction control signal terminal is electrically connected to the second scanning direction signal line.

According to a fourth aspect, an embodiment of the present disclosure provides a display panel, and the display panel includes: the above scanning drive circuit, and n rows of pixel drive circuits. The n rows of pixel drive circuits include $1^{st}$-row of pixel drive circuits to $n^{th}$-row of pixel drive circuit. Each row of the n rows of pixel drive circuits includes pixel drive circuits, and each of the pixel drive circuits includes a reset circuit and a data writing circuit. The reset circuits in a $q^{th}$-row of pixel drive circuits of the n rows of pixel drive circuits are electrically connected to the first output terminal of a $q^{th}$ shift register of the n shift registers, and each are configured to control, based on an effective level of the first output terminal of the $q^{th}$ shift register, the pixel drive circuits in the $q^{th}$-row of pixel drive circuits to enter a reset stage. The data writing circuits in the $q^{th}$-row of pixel drive circuits are electrically connected to the second output terminal of the $q^{th}$ shift register, and each are configured to control, based on an effective level of the second output terminal of the $q^{th}$ shift register, the pixel drive circuits in the $q^{th}$-row of pixel drive circuits to enter a data writing stage. In one of at least one scanning cycle of the scanning drive circuit, the reset stage of the $q^{th}$ shift register is prior to the data writing stage, where q=1, 2, 3, . . . , and n.

According to a fifth aspect, an embodiment of the present disclosure provides a display apparatus, including the above display panel.

BRIEF DESCRIPTION OF DRAWINGS

To describe the technical solutions in the embodiments of the present disclosure or in related technologies more clearly, the following briefly describes the accompanying drawings required for describing the embodiments or the related technologies. The accompanying drawings in the following description show some embodiments of the present disclosure, and a person of ordinary skill in the art may still obtain other drawings from these accompanying drawings.

DESCRIPTION OF EMBODIMENTS

To make the objective, technical solutions, and advantages of the present disclosure clearer, the technical solutions in the embodiments of the present disclosure are clearly and completely described below with reference to the accompanying drawings in the embodiments of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments and appended claims of the present disclosure include plural forms.

Figure 1:
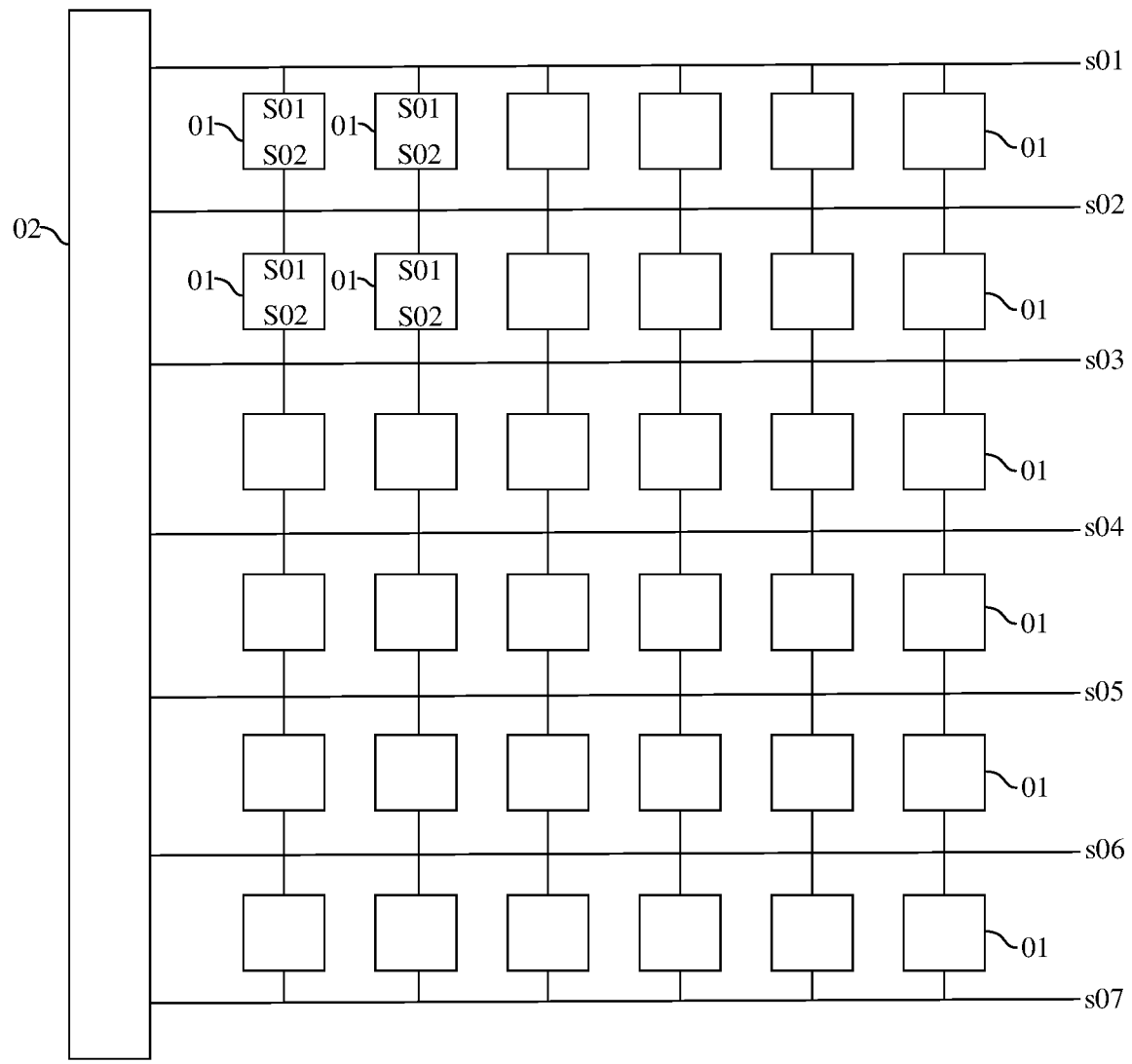
FIG. 1 is a schematic diagram of a partial structure of a display panel in the related art.
Figure 2:
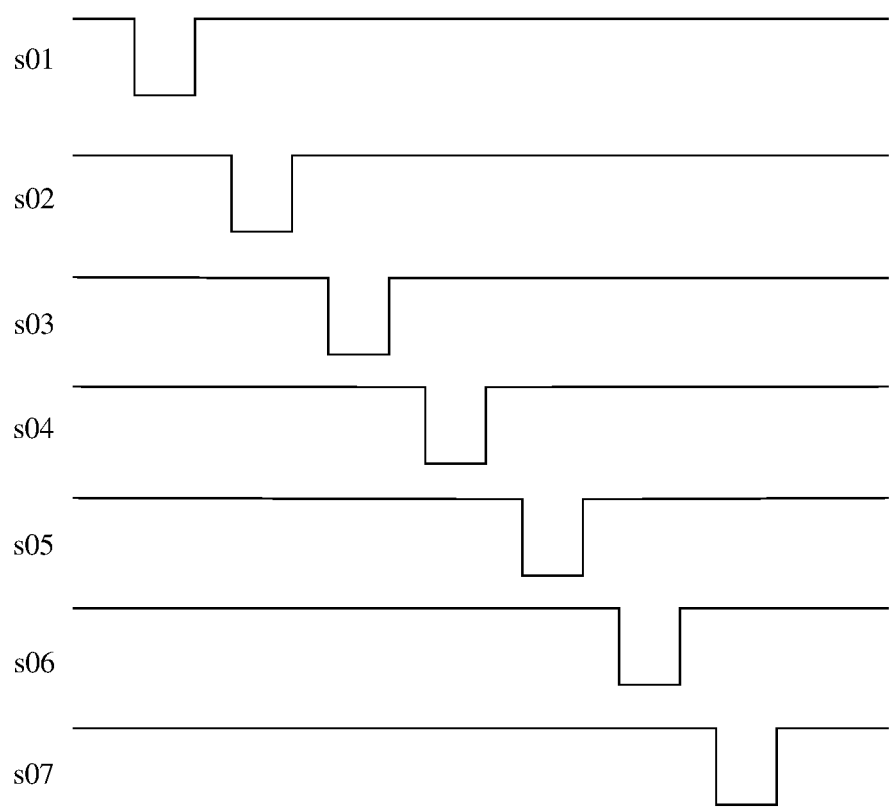
FIG. 2 is a signal timing diagram of each signal line in FIG. 1.

The problems in the related art are first explained before describing the embodiments of the present disclosure. As shown in FIG. 1, a display panel includes a plurality of pixel drive circuits 01 arranged in an array, and each pixel drive circuit 01 is configured to drive a light emitting device to emit light, so that a plurality of light emitting devices emit light to form an image to be displayed. The pixel drive circuit 01 includes a reset circuit and a data writing circuit. The reset circuit is configured to control the pixel drive circuit 01 to enter a reset stage, and the data writing circuit is configured to control the pixel drive circuit 01 to enter a data writing stage. In a period of one frame, all the pixel drive circuits 01 are to be scanned once, to enable all the pixel drive circuits 01 to drive the corresponding light emitting devices to refresh a screen. In a process of scanning the pixel drive circuit 01 once, the pixel drive circuit 01 first enters the reset stage to be reset, and then enter the data writing stage to write data to the pixel drive circuit 01. A scanning drive circuit 02 controls, based on a scanning signal transmitted by a scanning line, the pixel drive circuit 01 to enter the reset stage and the data writing stage. The reset circuit of the pixel drive circuit 01 has a reset control terminal S01, and the data writing circuit of the pixel drive circuit 01 has a data writing control terminal S02. The scanning drive circuit 02 is connected to a plurality of scanning lines, for example, scanning lines s01 to s07 shown in FIG. 1. The scanning line s01 is electrically connected to the reset control terminals S01 of the pixel drive circuits 01 in a $1^{st}$-row, the scanning line s02 is electrically connected to the data writing control terminals S02 of the pixel drive circuits 01 in the $1^{st}$-row and the reset control terminals S01 of the pixel drive circuits 01 in a $2^{nd}$-row, the scanning line s03 is electrically connected to the data writing control terminals S02 of the pixel drive circuits 01 in the $2^{nd}$-row and the reset control terminals S01 of the pixel drive circuits 01 in a $3^{rd}$-row, and so on. As shown in FIG. 2, the scanning lines provide effective levels (for example, a low level) successively to drive the pixel driving circuits 01 in each row to write data successively to refresh the screen. It is ensured that the pixel drive circuit 01 is reset before data writing. Based on the structure shown in FIG. 1, bottom-up screen refreshing cannot be realized by simply changing a scanning sequence of the seven scan lines s01 to s07 to bottom-up scanning, because it is impossible to reset each pixel drive circuit 01 before data writing. Therefore, to change the screen refreshing direction, an additional scanning drive circuit can be provided. In this way, large space area is occupied, which is not conducive to design of a narrow bezel. For the above reason, the technical solutions of the embodiments of the present disclosure are proposed. The technical solutions of the embodiments of the present disclosure are described below.

Figure 3:
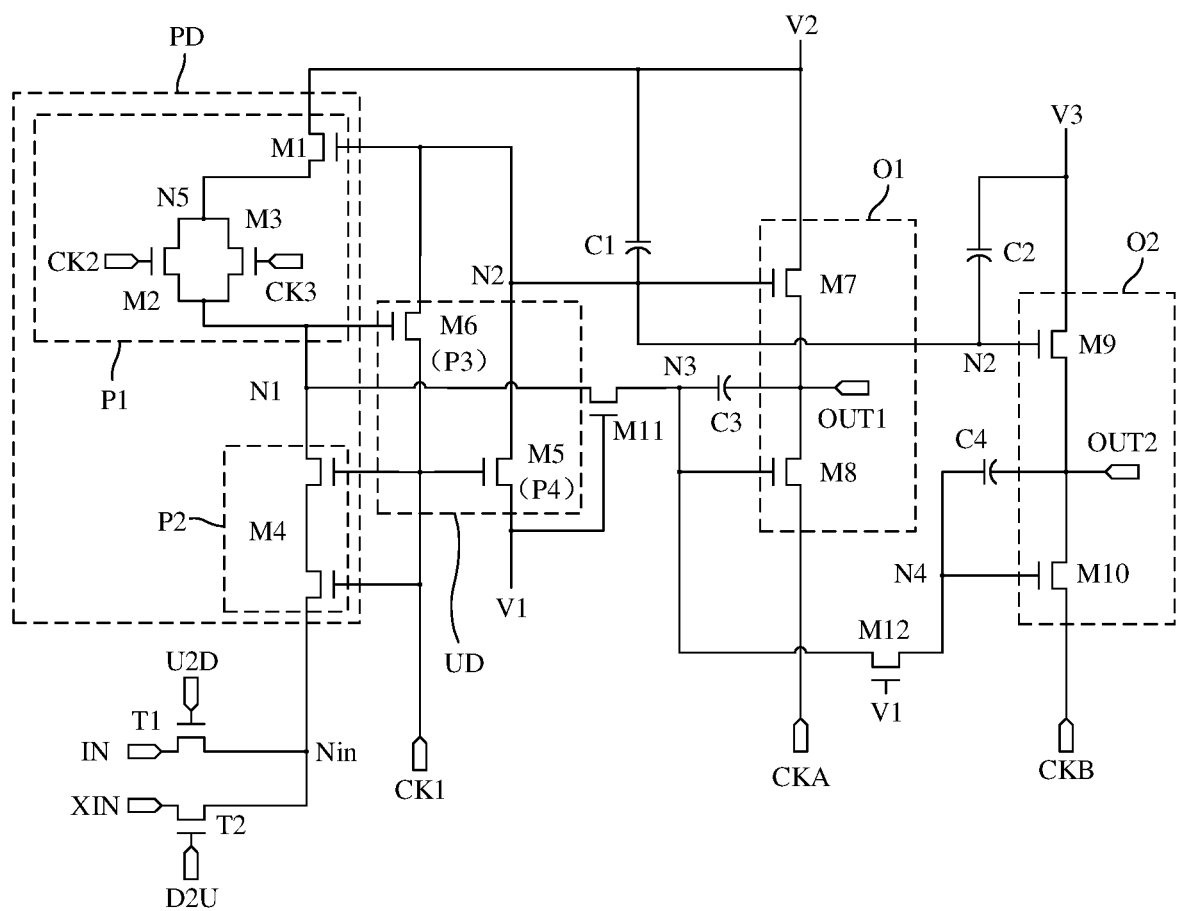
FIG. 3 is a schematic diagram of a circuit structure of a shift register according to an embodiment of the present disclosure.
Figure 4:
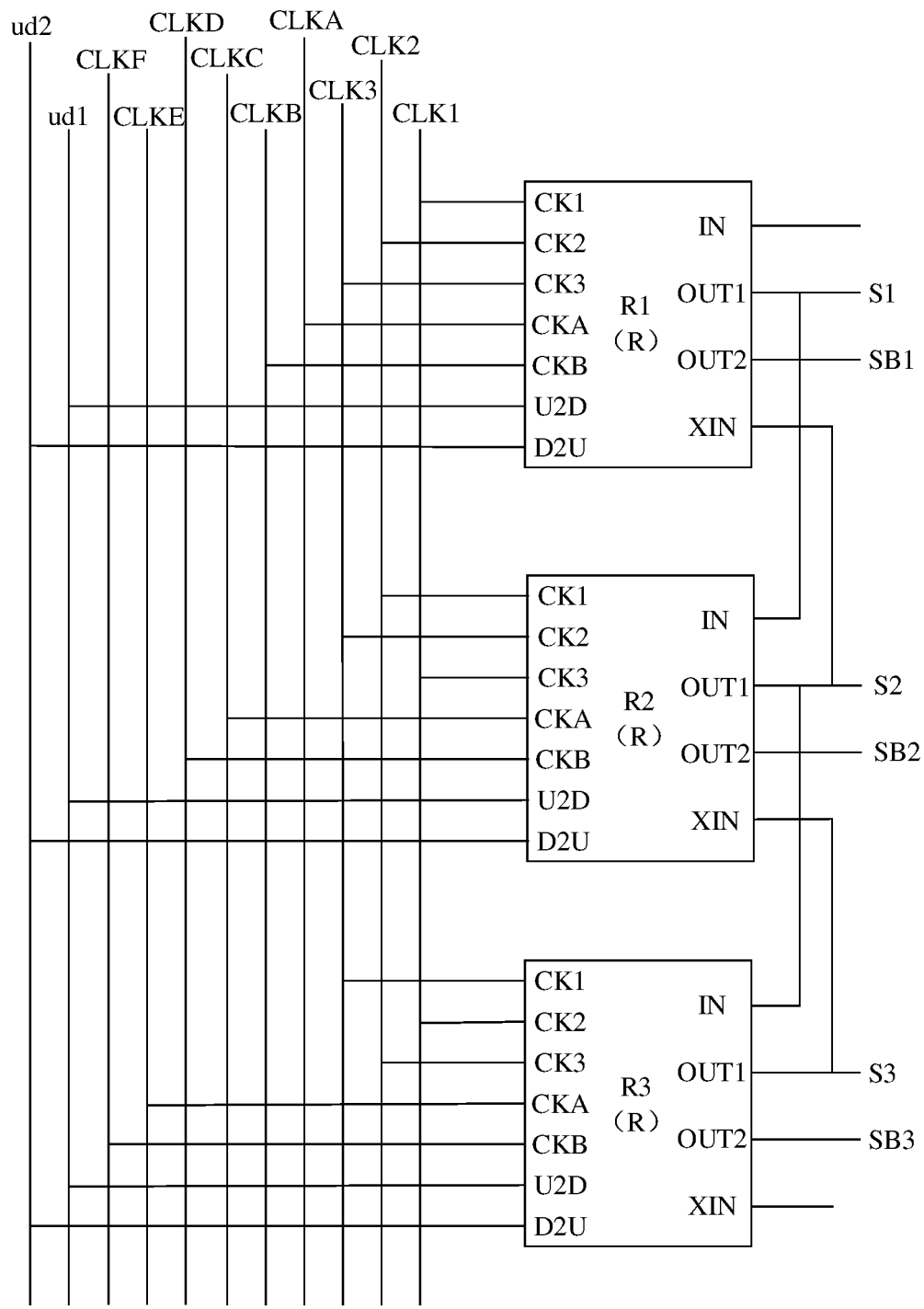
FIG. 4 is a schematic diagram of a partial structure of a scanning drive circuit according to an embodiment of the present disclosure.

As shown in FIG. 3 and FIG. 4, an embodiment of the present disclosure provides a scanning drive circuit, and the scanning drive circuit includes n shift registers. The n shift registers include a $1^{st}$ shift register to an $n^{th}$ shift register R. In FIG. 4, only three shift registers R are illustrated: a $1^{st}$ shift register R1, a $2^{nd}$ shift register R2, and a $3^{rd}$ shift register R3. Each shift register R includes an input node Nin, a first node N1, a second node N2, a third node N3, a fourth node N4, a first output terminal OUT1, a second output terminal OUT2, a pull-down unit PD, a pull-up unit UD, a first output unit O1, and a second output unit O2. The first node N1 is electrically connected to the third node N3, and the third node N3 is electrically connected to the fourth node N4. The pull-down unit PD is electrically connected to the first node N1 and the input node Nin, and is controlled by a first clock signal and a second clock signal to provide a level (i.e., voltage level) for the first node N1, the first clock signal is provided by a first clock signal terminal CK1, and the second clock signal is provided by a second clock signal terminal CK2. The pull-up unit UD is electrically connected to the second node N2 and a first supply voltage terminal V1, and is controlled by the first clock signal to provide a level for the second node N2. The first output unit O1 is electrically connected to a second supply voltage terminal V2 and a first clock signal output terminal CKA, and outputs a level to the first output terminal OUT1 based on the voltage of the second node N2 and a level of the third node N3. The second output unit O2 is electrically connected to a third supply voltage terminal V3 and a second clock signal output terminal CKB, and outputs a level to the second output terminal OUT2 based on the voltage of the second node N2 and a level of the fourth node N4. In one scanning cycle of the scanning drive circuit, the first output terminal OUT1 and the second output terminal OUT2 of each shift register R output effective levels successively.

In an embodiment, the pull-down unit PD is configured to control the level of the first node N1, and the level of the first node N1 is used to control the first output unit O1 and the second output unit O2 to output the effective levels. The pull-up unit UD is configured to control the level of the second node N2, and the level of the second node N2 is used to control ineffective levels of the first output unit O1 and the second output unit O2. Each shift register Rhas the first output terminal OUT1 and second output terminal OUT2 that are independent from each other, and the first output terminal OUT1 and the second output terminal OUT2 output the effective levels successively. Therefore, when the scanning drive circuit including the cascaded shift registers R performs forward scanning, in other words, in a process in which first output terminals OUT1 of the $1^{st}$ to the $n^{th}$ shift registers R output an effective level successively, it can be ensured that the second output terminal OUT2 of each shift register R outputs the effective level after an adjacent period. In this way, signals output by the first output terminal OUT1 and the second output terminal OUT2 of a same shift register R can be respectively provided to reset circuits and data writing circuits of pixel drive circuits in a same row to control scanning of the pixel drive circuits. In reverse scanning, namely, in a process in which first output terminals OUT1 of the $n^{th}$ shift register R to the $1^{st}$ shift register R output an effective level successively, it can also be ensured that the second output terminal OUT2 of each shift register R can output the effective level after an adjacent period. In this way, the $n^{th}$ row of the pixel drive circuits to the $1^{st}$ row of pixel drive circuits can be scanned under control of a same scanning drive circuit.

Figure 5:
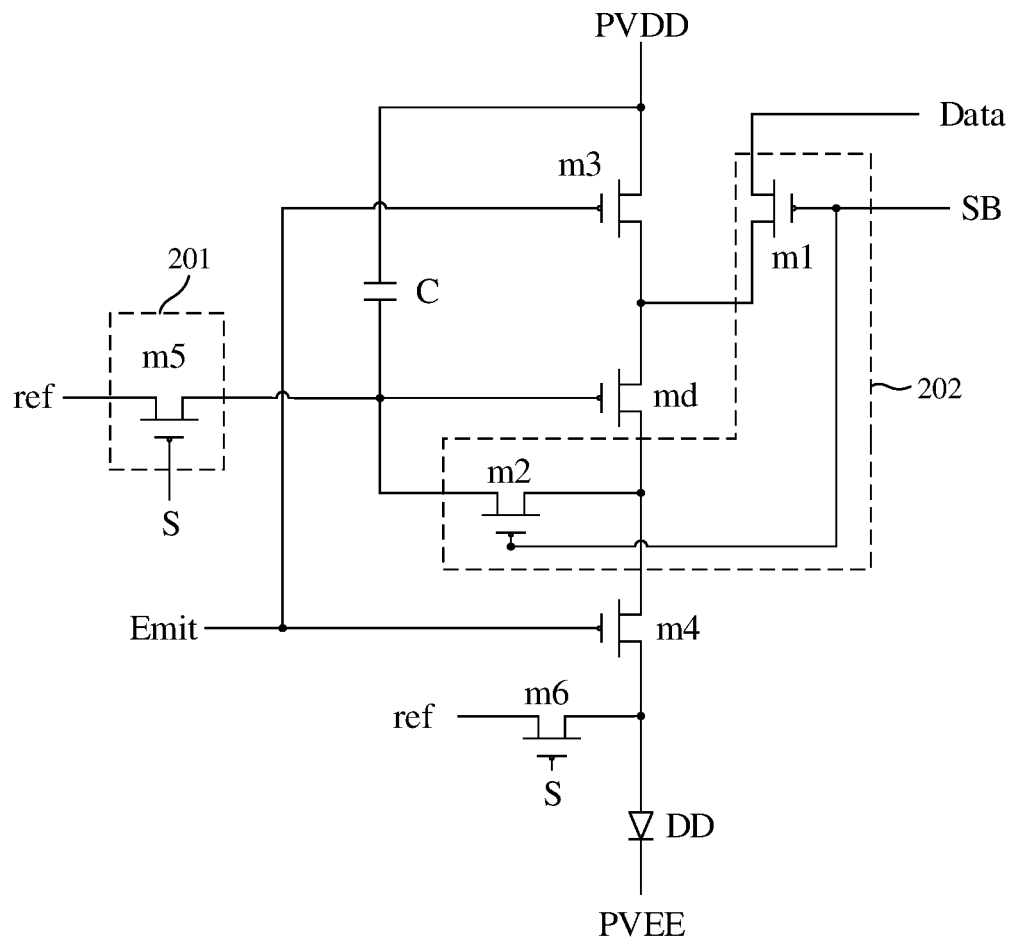
FIG. 5 is a schematic diagram of a circuit structure of a pixel drive circuit according to an embodiment of the present disclosure.
Figure 6:
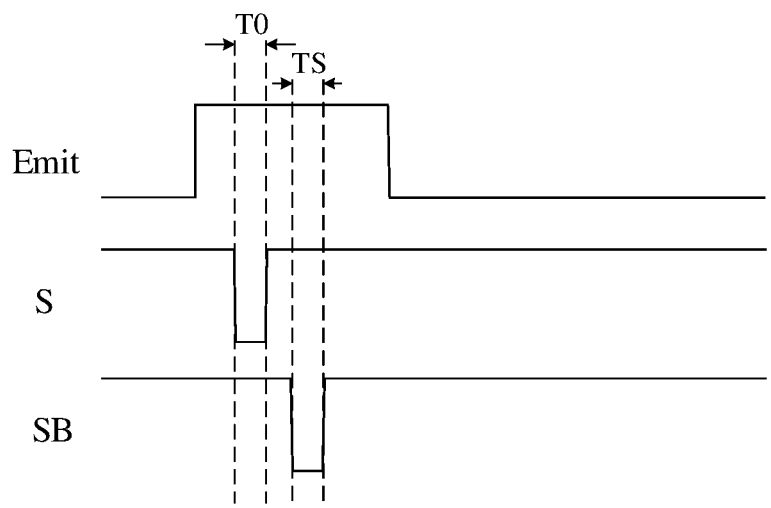
FIG. 6 is a signal timing diagram corresponding to the pixel drive circuit in FIG. 5.
Figure 7:
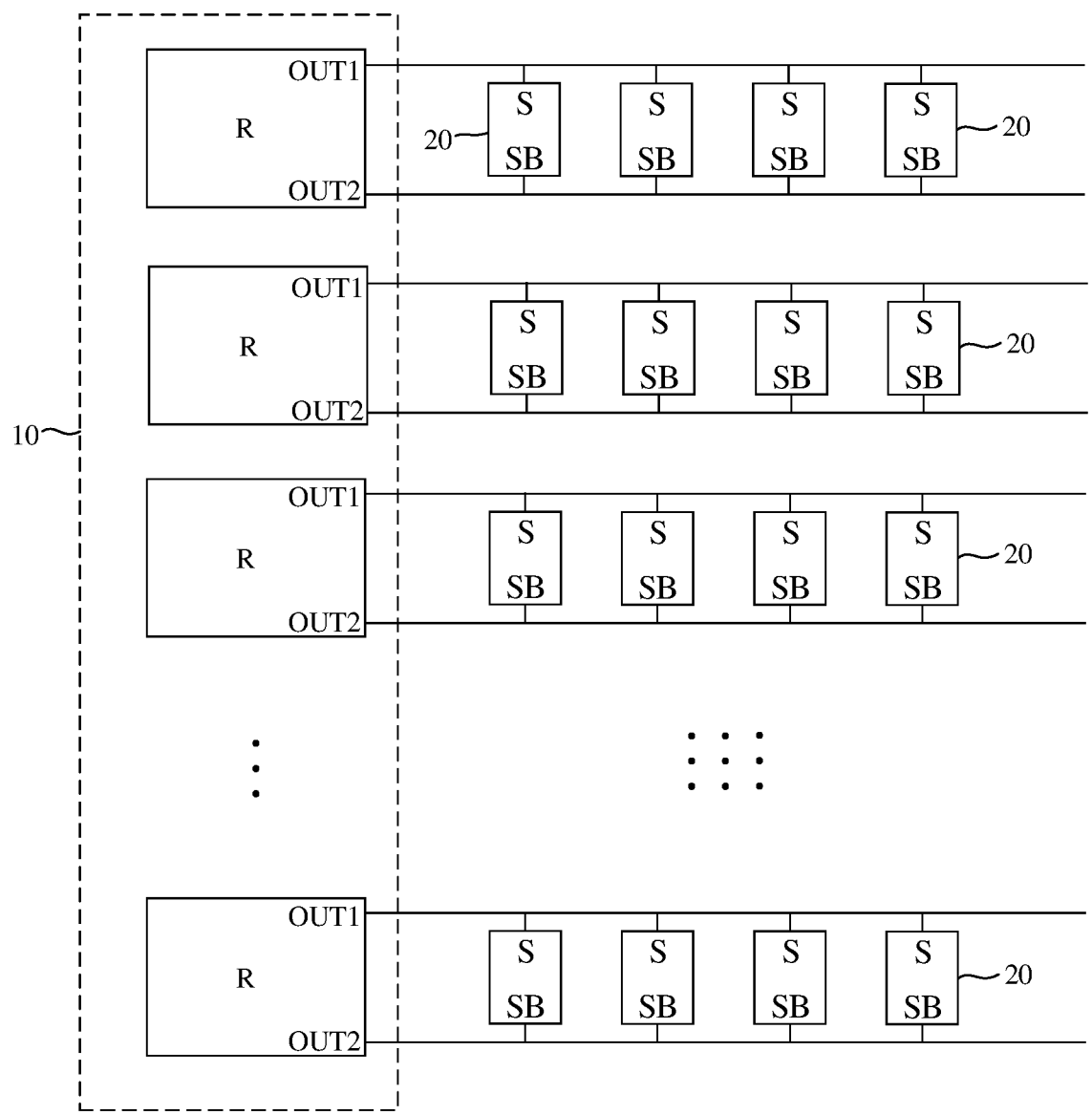
FIG. 7 is a schematic diagram of a partial structure of a display panel according to an embodiment of the present disclosure.

As shown in FIG. 5, FIG. 6, and FIG. 7, an embodiment of the present disclosure further provides a display panel. The display panel includes: the above scanning drive circuit 10, and n rows of pixel drive circuits ($1^{st}$-row of pixel drive circuits to $n^{th}$-row of pixel drive circuits). Each row of pixel drive circuits includes a plurality of pixel drive circuits 20, and each pixel drive circuit 20 includes a reset circuit 201 and a data writing circuit 202. The first output terminal OUT1 of a $q^{th}$ shift register R is electrically connected to the reset circuits 201 of the pixel drive circuits 20 in a $q^{th}$-row of pixel drive circuits, and the second output terminal OUT2 of the $q^{th}$ shift register R is electrically connected to the data writing circuits 202 of the pixel drive circuits 20 in the $q^{th}$-row of pixel drive circuit. The reset circuit 201 controls, based on an effective level of the first output terminal OUT1 of the $q^{th}$ shift register R, the pixel drive circuit 20 to enter a reset stage, and the data writing circuit 202 controls, based on an effective level of the second output terminal OUT2 of the $q^{th}$ shift register R, the pixel drive circuit 20 to enter a data writing stage. In one scanning cycle (namely, in a period of one frame) of the scanning drive circuit 10, the reset stage of the $q^{th}$ shift register R is prior to the data writing stage, where q=1, 2, 3, . . . , and n.

For example, the pixel drive circuit 20 can include a drive transistor md and a first pixel transistor m1 to a sixth pixel transistor m6. The pixel drive circuit 20 can further include a capacitor C and a light emitting device DD. The third pixel transistor m3, the drive transistor md, the fourth pixel transistor m4, and the light emitting device DD are connected in series between a first power supply terminal PVDD and a second power supply terminal PVEE. The first pixel transistor m1 and the second pixel transistor m2 belong to the data writing circuit 202. The data writing circuit 202 has a data writing control terminal SB, and the data writing control terminal SB is electrically connected to a gate of the first pixel transistor m1 and a gate of the second pixel transistor m2, and is configured to control data writing. When the data writing control terminal SB provides a turn-on level, the first pixel transistor m1 and the second pixel transistor m2 are turned on, a data voltage on a data line Data is written into the pixel drive circuit to enable the pixel drive circuit 20 to enter the data writing stage TS. The fifth pixel transistor m5 belongs to the reset circuit 201. The reset circuit 201 has a reset control terminal S, and the reset control terminal S is electrically connected to a gate of the fifth pixel transistor m5 and is configured to control reset. When the reset control terminal S provides a turn-on level, the fifth pixel transistor m5 is turned on, a level on a reset signal line ref is transmitted to a gate of the drive transistor md, to enable the pixel drive circuit 20 to enter the reset stage T0. In addition, a gate of the third pixel transistor m3 and a gate of the fourth pixel transistor m4 are electrically connected to a light emitting control terminal Emit, to control whether the light emitting device DD emits light. A gate of the sixth pixel transistor m6 can also be electrically connected to the reset control terminal S, in other words, the sixth pixel transistor m6 can also reset an anode of the light emitting device DD by using the level on the reset signal line ref in the reset phase T0. In an embodiment, the sixth pixel transistor m6 can reset the anode of the light emitting device DD in another period. To ensure normal operation of the pixel drive circuit 20, the reset stage T0 can be prior to the data writing stage TS. Reset control terminals S of reset circuits 201 of the pixel drive circuits 20 in each row are electrically connected to the first output terminal OUT1 of a corresponding shift register R, and data writing control terminals SB of data writing circuits 202 of the pixel drive circuits 20 in each row are electrically connected to the second output terminal OUT2 of the corresponding shift register R. The structure of the pixel drive circuit 20 is not limited in the present disclosure, and the structure of the pixel driving circuit shown in FIG. 5 is only an example.

In the scanning drive circuit and the display panel that are provided in an embodiment of the present disclosure, each shift register R has the first output terminal OUT1 and second output terminal OUT2 that are independent from each other, and the first output terminal OUT1 and the second output terminal OUT2 output the effective level successively. In a process in which first output terminals OUT1 of the $1^{st}$ shift register R to the $n^{th}$ shift register R output an effective level successively, it can be ensured that the second output terminal OUT2 of each shift register R outputs the effective level after an adjacent period. In a process in which the first output terminals OUT1 of the $n^{th}$ shift register R to the $1^{st}$ shift register R output an effective level successively, it can also be ensured that the second output terminal OUT2 of each shift register R outputs the effective level after an adjacent period. In this way, a forward scanning and a reverse scanning of the pixel drive circuit can be performed by a same scanning drive circuit while ensuring driving control of the pixel drive circuit. Compared with the related art, the present disclosure reduces space occupation and facilitates design of a narrow bezel because no additional scanning drive circuit is provided.

In an embodiment, each shift register R further includes: a first input terminal IN, a second input terminal XIN, a first scanning direction control signal terminal U2D, a second scanning direction control signal terminal D2U, a first input transistor T1, and a second input transistor T2. The first input transistor T1 is connected in series between the first input terminal IN and the input node Nin, and a control terminal of the first input transistor T1 is electrically connected to the first scanning direction control signal terminal U2D. The second input transistor T2 is connected in series between the second input terminal XIN and the input node Nin, and a control terminal of the second input transistor T2 is electrically connected to the second scanning direction control signal terminal D2U. In a $j^{th}$ shift register R, the first input terminal IN is electrically connected to the first output terminal OUT1 of a $(j-1)^{th}$ shift register R, where j=2, 3, . . . , and n. In a $k^{th}$ shift register R, the second input terminal XIN is electrically connected to the first output terminal OUT1 of a $(k+1)^{th}$ shift register, where k=1, 2, 3, . . . , and n−1.

In an embodiment, the first input terminal IN of the $2^{nd}$ shift register R2 is electrically connected to the first output terminal OUT1 of the $1^{st}$ shift register R1, the first input terminal IN of the $3^{rd}$ shift register R3 is electrically connected to the first output terminal OUT1 of the $2^{nd}$ shift register R2, and so on. The first input terminal IN of the shift register R excluding the $1^{st}$ shift register R1 is electrically connected to the first output terminal OUT1 of a previous shift register R. The first input terminal IN of the $1^{st}$ shift register R1 can be electrically connected to a drive chip and controlled directly by the drive chip. The second input terminal XIN of the $1^{st}$ shift register R1 is electrically connected to the first output terminal OUT1 of the $2^{nd}$ shift register R2, the second input terminal XIN of the $2^{nd}$ shift register R2 is electrically connected to the first output terminal OUT1 of the $3^{rd}$ shift register R3, and so on. The second input terminal XIN of each shift register R excluding a last shift register R is electrically connected to the first output terminal OUT1 of a next shift register R. The second input terminal XIN of the last shift register R can be electrically connected to the drive chip and controlled directly by the drive chip. The first input terminal IN is configured to provide an input signal for the shift register R in a forward scanning process, and the second input terminal XIN is configured to provide an input signal for the shift register R in a reverse scanning process. Each first input terminal IN is cascaded with a previous shift register R. Even in the forward scanning process, each shift register R performs shifting based on a signal of the first output terminal OUT1 of a previous shift register R. Each second input terminal XIN is cascaded with a next shift register R. Even in the reverse scanning process, each shift register R performs shifting based on a signal of the first output terminal OUT1 of a next shift register R.

In an embodiment, each shift register R further includes a fifth node N5, the first clock signal terminal CK1 configured to provide the first clock signal, and the second clock signal terminal CK2 configured to provide the second clock signal; the pull-down unit PD includes a first transmission unit P1 and a second transmission unit P2, the first transmission unit P1 is connected in series between the second supply voltage terminal V2 and the first node N1 and configured to transmit the level to the first node N1 based on the level of the second node N2 and the second clock signal, the second transmission unit P2 is connected in series between the first node N1 and the input node Nin and is configured to transmit the level to the first node N1 based on the first clock signal.

Figure 8:
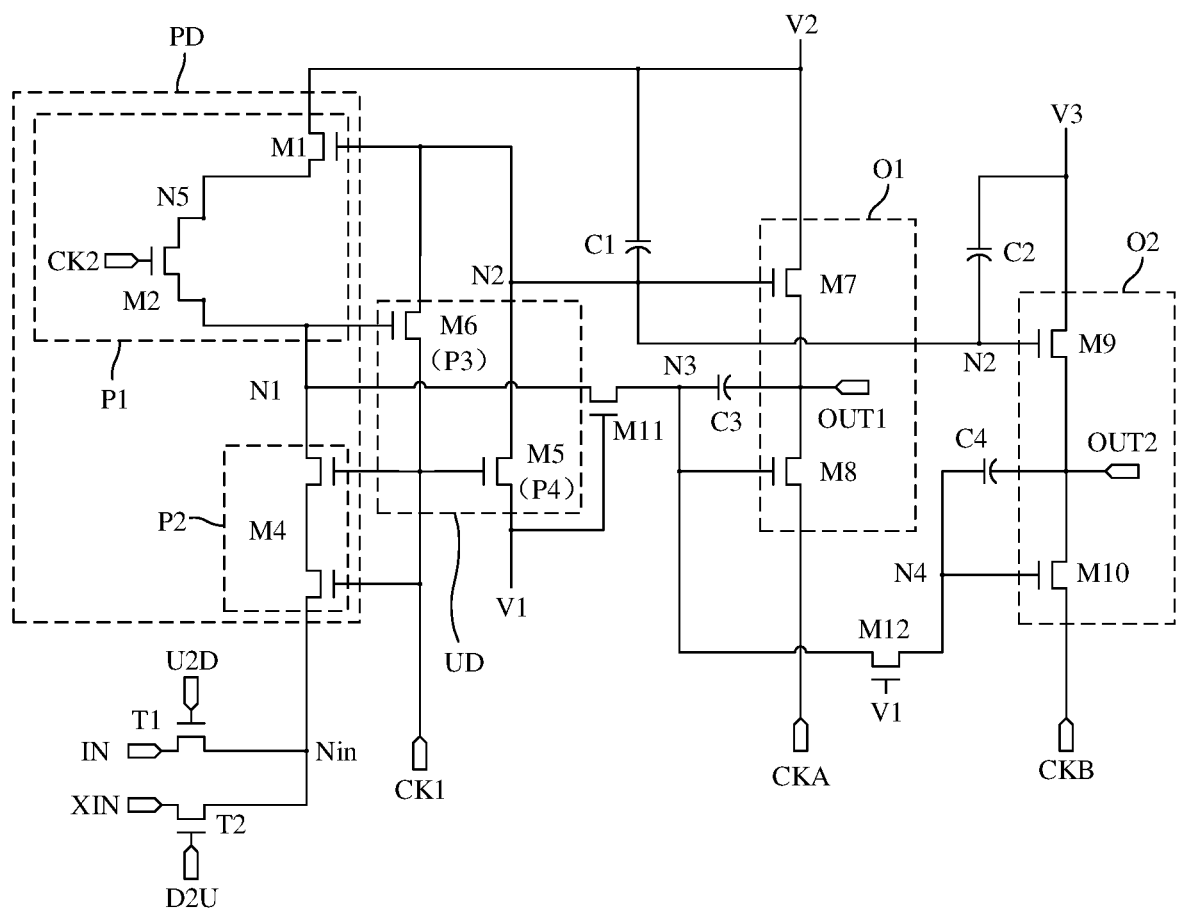
FIG. 8 is a schematic diagram of a circuit structure of another shift register according to an embodiment of the present disclosure.

In an embodiment, each shift register R further includes a third clock signal terminal CK3 configured to provide a third clock signal; the first transmission unit P1 includes a first transistor M1 connected in series between the second supply voltage terminal V2 and the fifth node N5, a second transistor M2 connected in series between the fifth node N5 and the first node N1, and a third transistor M3 connected in parallel to the second transistor M2; a control terminal of the first transistor M1 is electrically connected to the second node N2, a control terminal of the second transistor M2 is electrically connected to the second clock signal terminal CK2, a control terminal of the third transistor M3 is electrically connected to the third clock signal terminal CK3. The second transmission unit P2 can include a fourth transistor M4 connected in series between the first node N1 and the input node Nin, and a control terminal of the fourth transistor M4 is electrically connected to the first clock signal terminal CK1. The second supply voltage terminal V2 is configured to provide an ineffective level (for example, a high level). As shown in FIG. 8, the first transmission unit P1 can not include the third transistor M3, but includes the first transistor M1 and the second transistor M2. However, the embodiment in which the first transmission unit P1 as shown in FIG. 3 includes the third transistor M3, can guarantee an output effect, and the principle and process will be described in detail in the following.

In an embodiment, each shift register R further includes a first clock signal terminal CK1 configured to provide the first clock signal, the pull-up unit UD includes a third transmission unit P3 connected in series between the second node N2 and the first clock signal terminal CK1, and the fourth transmission unit P4 connected in series between the second node N2 and the first supply voltage terminal V1; the fourth transmission unit P4 is configured to transmit the level to the second node N2 based on the first clock signal, and the third transmission unit P3 is configured to transmit the level to the second node N2 based on the level of the first node N1. The first supply voltage terminal V1 is configured to provide an effective level (for example, a low level).

In an embodiment, the fourth transmission unit P4 includes a fifth transistor M5 connected in series between the second node N2 and the first supply voltage terminal V1, a control terminal of the fifth transistor M5 is electrically connected to the first clock signal terminal CK1, the third transmission unit P3 includes a sixth transistor M6 connected in series between the second node N2 and the first clock signal terminal CK1, and a control terminal of the sixth transistor M6 is electrically connected to the first node N1.

In an embodiment, the first output unit O1 includes a seventh transistor M7 connected in series between the second supply voltage terminal V2 and the first output terminal OUT1, and an eighth transistor M8 connected in series between the first output terminal OUT1 and the first clock signal output terminal CKA; a control terminal of the seventh transistor M7 is electrically connected to the second node N2, and a control terminal of the eighth transistor M8 is electrically connected to the third node N3; the second output unit O2 includes a ninth transistor M9 connected in series between the third supply voltage terminal V3 and the second output terminal OUT2, and a tenth transistor M10 connected in series between the second output terminal OUT2 and the second clock signal output terminal CKB, a control terminal of the ninth transistor M9 is electrically connected to the second node N2, and a control terminal of the tenth transistor M10 is electrically connected to the fourth node N4; and the third supply voltage terminal V3 is configured to provide an ineffective level (for example, a high level). In an embodiment, the third supply voltage terminal V3 and the second supply voltage terminal V2 are a same terminal, in other words, the third supply voltage terminal V3 and the second supply voltage terminal V2 can provide a same voltage value. In another embodiment, the third supply voltage terminal V3 and the second supply voltage terminal V2 are different terminals, in other words, they can provide different voltage values (i.e., ineffective levels).

In an embodiment, each shift register R further includes a first capacitor C1 connected in series between the second supply voltage terminal V2 and the second node N2 and configured to maintain a potential of the second node N2.

In an embodiment, each shift register R further includes a second capacitor C2 connected in series between the third supply voltage terminal V3 and the second node N2, a distance between the first capacitor C1 and the seventh transistor M7 is smaller than a distance between the first capacitor C1 and the ninth transistor M9, and a distance between the second capacitor C2 and the seventh transistor M7 is greater than a distance between the second capacitor C2 and the ninth transistor M9.

Figure 9:
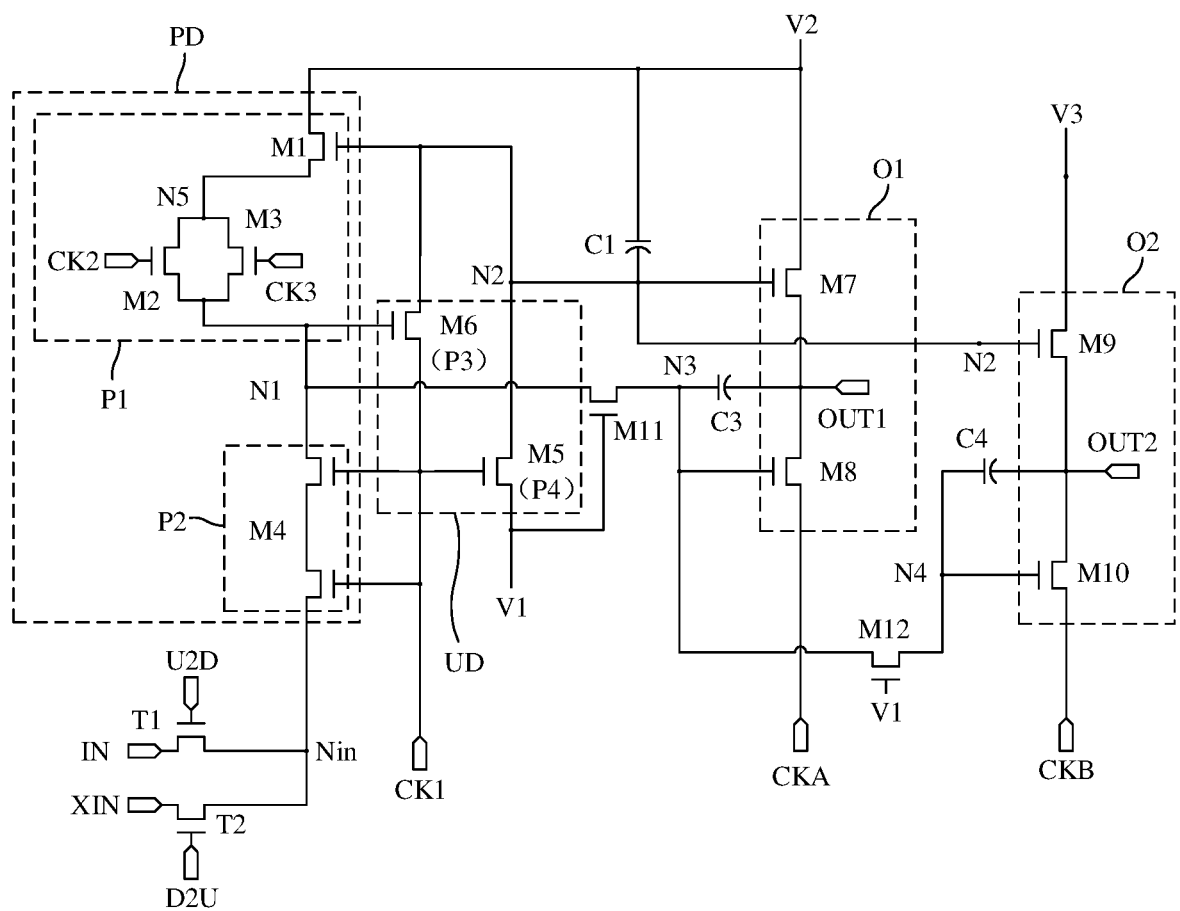
FIG. 9 is a schematic diagram of a circuit structure of another shift register according to an embodiment of the present disclosure.

In an embodiment, even if the third supply voltage terminal V3 and the second supply voltage terminal V2 are a same terminal, the first capacitor C1 corresponding to the seventh transistor M7 and the second capacitor C2 corresponding to the ninth transistor M9 can be provided. A size of the first capacitor C1 and a size of the second capacitor C2 can be the same, the first capacitor C1 is closer to the seventh transistor M7, and the second capacitor C2 is closer to the ninth transistor M9, so that the first capacitor C1 and the capacitor C2 are connected in parallel to maintain the potential of the second node N2. Since the function of one capacitor is realized by two capacitors, compared with configuration in which only one capacitor is used, the configuration in which the capacitor closer to the seventh transistor M7 and the capacitor closer to the ninth transistor M9 are provided can maintain potentials corresponding to gates of the two transistors more stably. Because loads corresponding to the first output terminal OUT1 and the second output terminal OUT2 are different, the size of the first capacitor C1 and the size of the second capacitor C2 can be different. Similarly, because the loads corresponding to the first output terminal OUT1 and the second output terminal OUT2 are different, a width-to-length ratio of the seventh transistor M7 and a width-to-length ratio of the ninth transistor M9 can be different, and a width-to-length ratio of the eighth transistor M8 and a width-to-length ratio of the tenth transistor M10 can be different, to adapt to loads of different output terminals. As shown in FIG. 9, in other embodiments, the third supply voltage terminal V3 and the second supply voltage terminal V2 are a same terminal, but the shift register includes the first capacitor C1 and does not include the second capacitor. This is because the first capacitor C1 is connected in series between the second supply voltage terminal V2 and the second node N2, and can realize functions of the first capacitor C1 and the second capacitor C2 that are shown in FIG. 8.

In an embodiment, each shift register R further includes a third capacitor C3 connected in series between the third node N3 and the first output terminal OUT1, and a fourth capacitor C4 connected in series between the fourth node N4 and the second output terminal OUT2, and the third capacitor C3 is configured to maintain a potential of the third node N3 and change the potential of the third node N3 through capacitive coupling. For example, as a bootstrap capacitor, the third capacitor C3 is mainly used to: when the eighth transistor M8 is turned on and a high level of the first output terminal OUT1 changes to a low level, enable, based on a coupling effect on the third capacitor C3, the potential of the third node N3 to be at a lower level, so that a level of a gate of the eighth transistor M8 is much lower than a low level of the first clock signal output terminal CKA, and the low level of the first clock signal output terminal CKA can be completely output. The fourth capacitor C4 is configured to maintain a potential of the fourth node N4 and change the potential of the fourth node N4 through capacitive coupling. For example, as a bootstrap capacitor, the fourth capacitor C4 is mainly used to: when the tenth transistor M10 is turned on and a high level of the second output terminal OUT2 changes to a low level, enable, based on a coupling effect on the fourth capacitor C4, the potential of the fourth node N4 to be at a lower level, so that a level of a gate of the tenth transistor M10 is much lower than a low level of the second clock signal output terminal CKB, and the low level of the second clock signal output terminal CKB can be completely output.

In an embodiment, each shift register R further includes an eleventh transistor M11, through which the first node N1 is electrically connected to the third node N3, and a control terminal of the eleventh transistor M11 is electrically connected to the first supply voltage terminal V1. The first supply voltage terminal V1 provides the effective level, and the effective level is used to control the transistor to be turned on, therefore, the eleventh transistor M11 is always turned on under control of the first supply voltage terminal V1, to reduce cross voltage of another transistor to protect the another transistor from being broken down. For example, when the eighth transistor M8 is turned on, and the high level of the first output terminal OUT1 is changed to the low level, in the process of enabling, based on the coupling effect on the third capacitor C3, the potential of the third node N3 to be at the lower level, a low level of the input node Nin is changed to a high level. In this case, if the eleventh transistor M11 is not provided, a difference between a level of a source of the fourth transistor M4 and a drain of the fourth transistor M4 is large, and the fourth transistor M4 is easily broken down and damaged. After the eleventh transistor M11 is provided, the difference between the level of the source of the fourth transistor M4 and the level of the drain terminal of the fourth transistor M4 can be reduced, to prevent the fourth transistor M4 from being broken down.

In an embodiment, each shift register R further includes a twelfth transistor M12, through which the third node N3 is electrically connected to the fourth node N4, and a control terminal of the twelfth transistor M12 is electrically connected to the first supply voltage terminal V1. That is, the twelfth transistor M12 is always turned on under control of the first supply voltage terminal V1, to increase a degree of isolation between the third node N3 and the fourth node N4. Due to a potential change of the first output terminal OUT1 affects the third node N3 due to the third capacitor C3, and a potential change of the second output terminal OUT2 affects the fourth node N4 due to the fourth capacitor C4, when timings of the first output terminal OUT1 and the second output terminal OUT2 are different, the twelfth transistor M12 can reduce mutual influence between the first output terminal OUT1 and the second output terminal OUT2, which makes an output more stable. For example, in a first forward scanning period t1 and a second forward scanning period t2, when a high level of the first clock signal output terminal CKA is changed to a low level, a potential of the first output terminal OUT1 is decreased, and the coupling effect on the third capacitor C1 decreases the potential of the third node N3, so that the eighth transistor M8 is fully turned on, and the level of the first output terminal OUT1 is consistent with a potential of the first clock signal output terminal OUIT1. In this way, the first clock signal output terminal CKA has no loss. Assuming that the twelfth transistor M12 is not provided, the third capacitor C3 and the fourth capacitor C4 are connected in parallel. The potential of the first output terminal OUT1 is decreased, and the coupling effect on the third capacitor C3 is reduced due to impact of the fourth capacitor C4, so that the potential of the third node N3 cannot become low enough. Therefore, the low level of the first clock signal output terminal CKA cannot be completely output to the first output terminal OUT1. Similarly, when a potential of the second output terminal OUT2 is changed from a high level to a low level, assuming that the twelfth transistor M12 is not provided, a coupling effect of the second output terminal OUT2 on the fourth capacitor C4 is weakened due to influence of the third capacitor C3, so that a low level of the second output terminal OUT2 is not low enough. If the twelfth transistor M12 is not provided, an output waveform will be adversely affected, and the output effect can be improved by providing the twelfth transistor M12.

Figure 10:
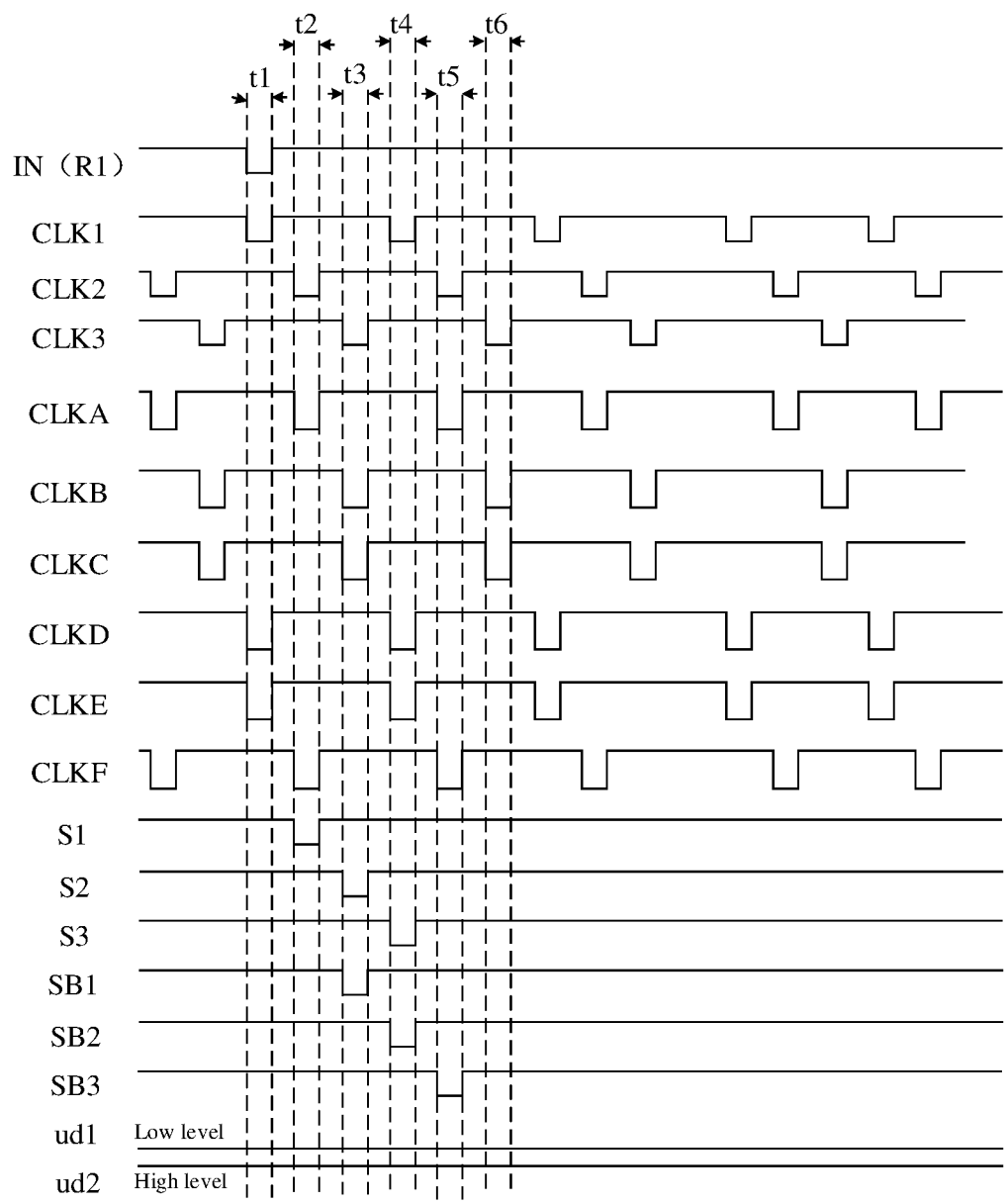
FIG. 10 is a signal timing diagram corresponding to forward scan by a scanning drive circuit according to an embodiment of the present disclosure.
Figure 11:
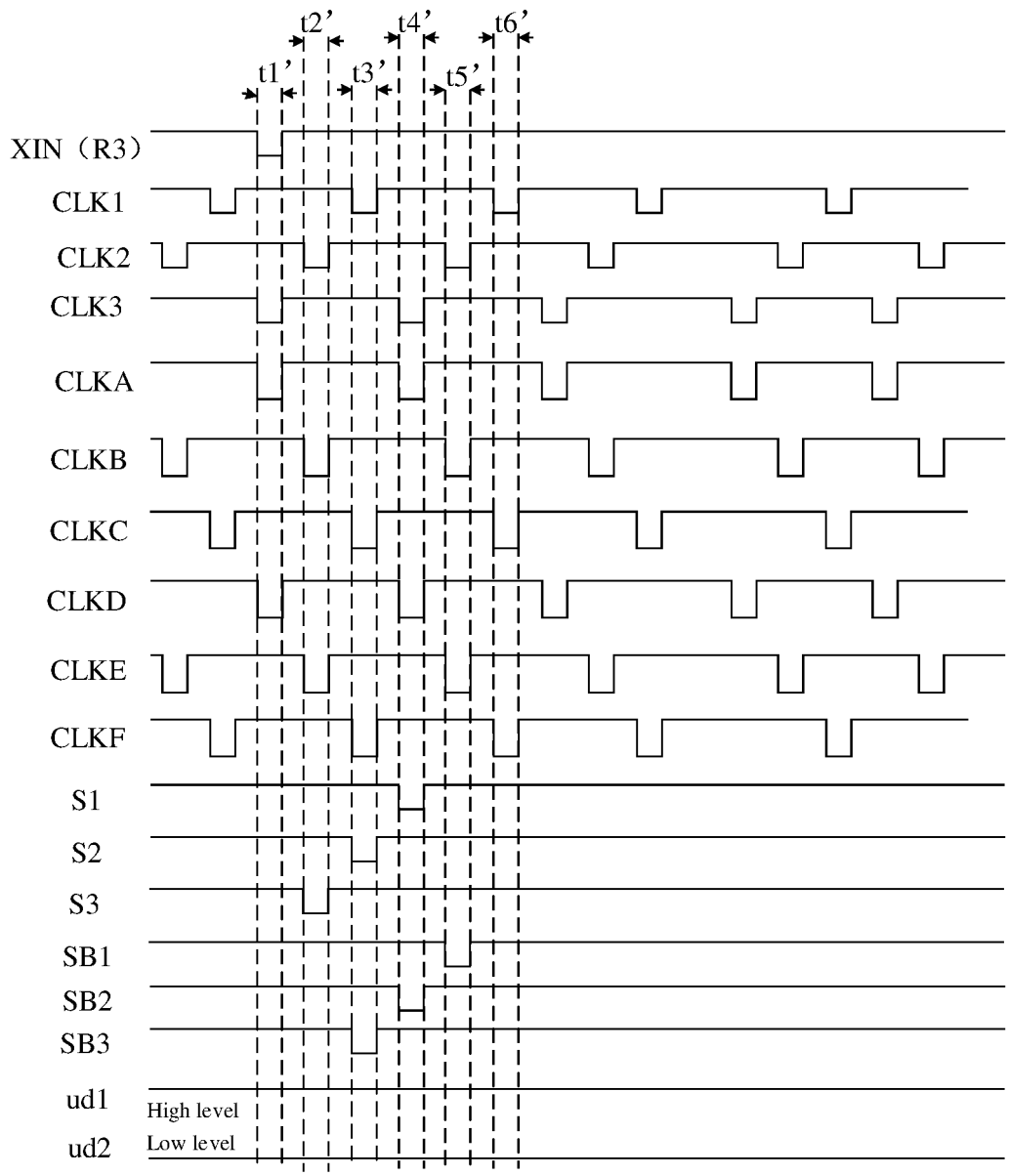
FIG. 11 is a signal timing diagram corresponding to reverse scan by a scanning drive circuit according to an embodiment of the present disclosure.
Figure 12:
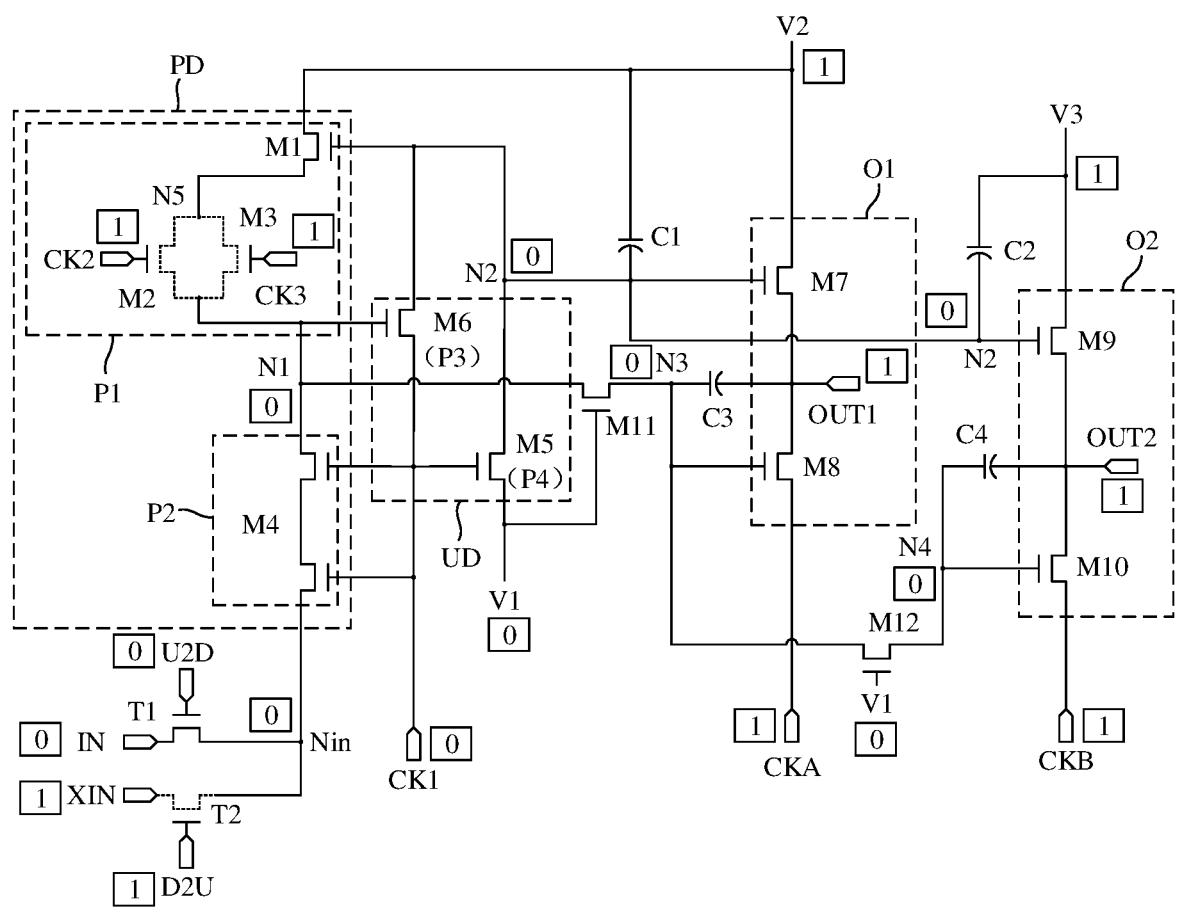
FIG. 12 is a schematic diagram showing a status of a shift register in a t1 period according to an embodiment of the present disclosure.
Figure 13:
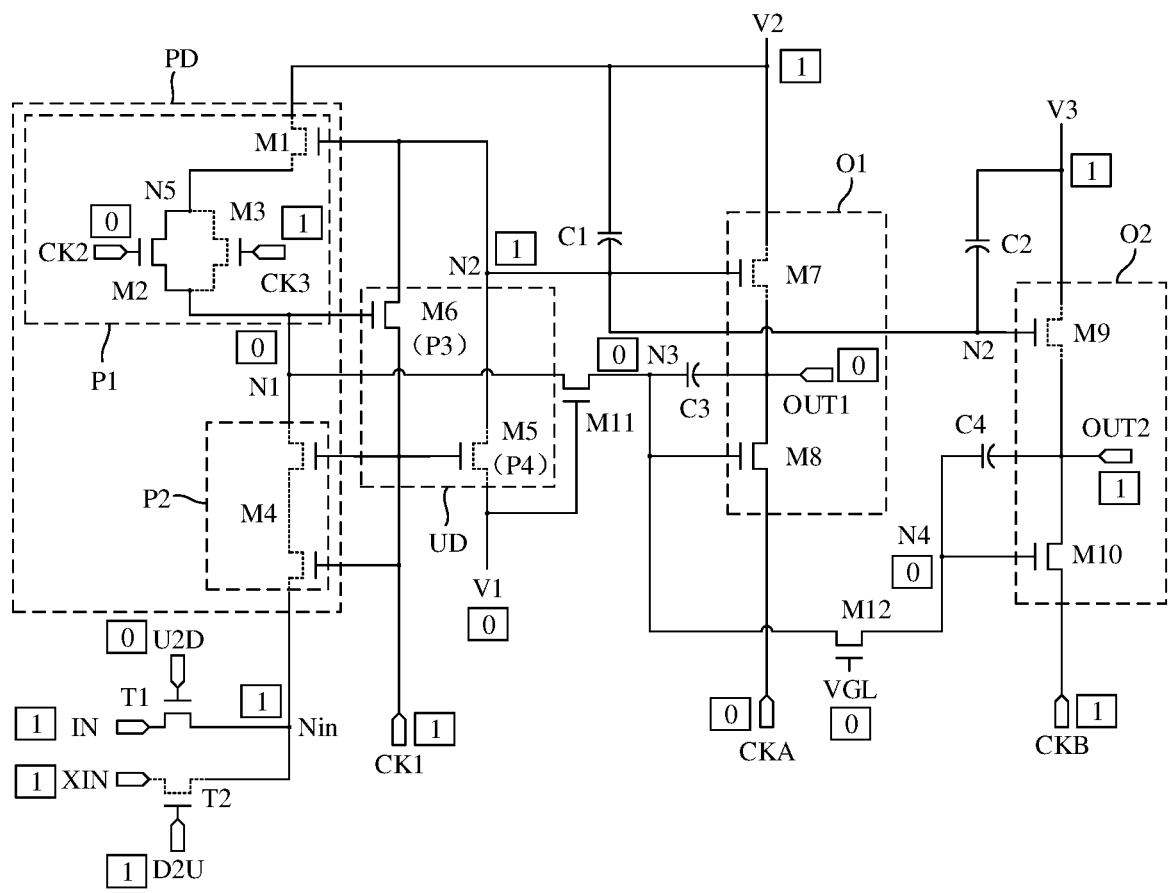
FIG. 13 is a schematic diagram showing a status of a shift register in a t2 period according to an embodiment of the present disclosure.
Figure 14:
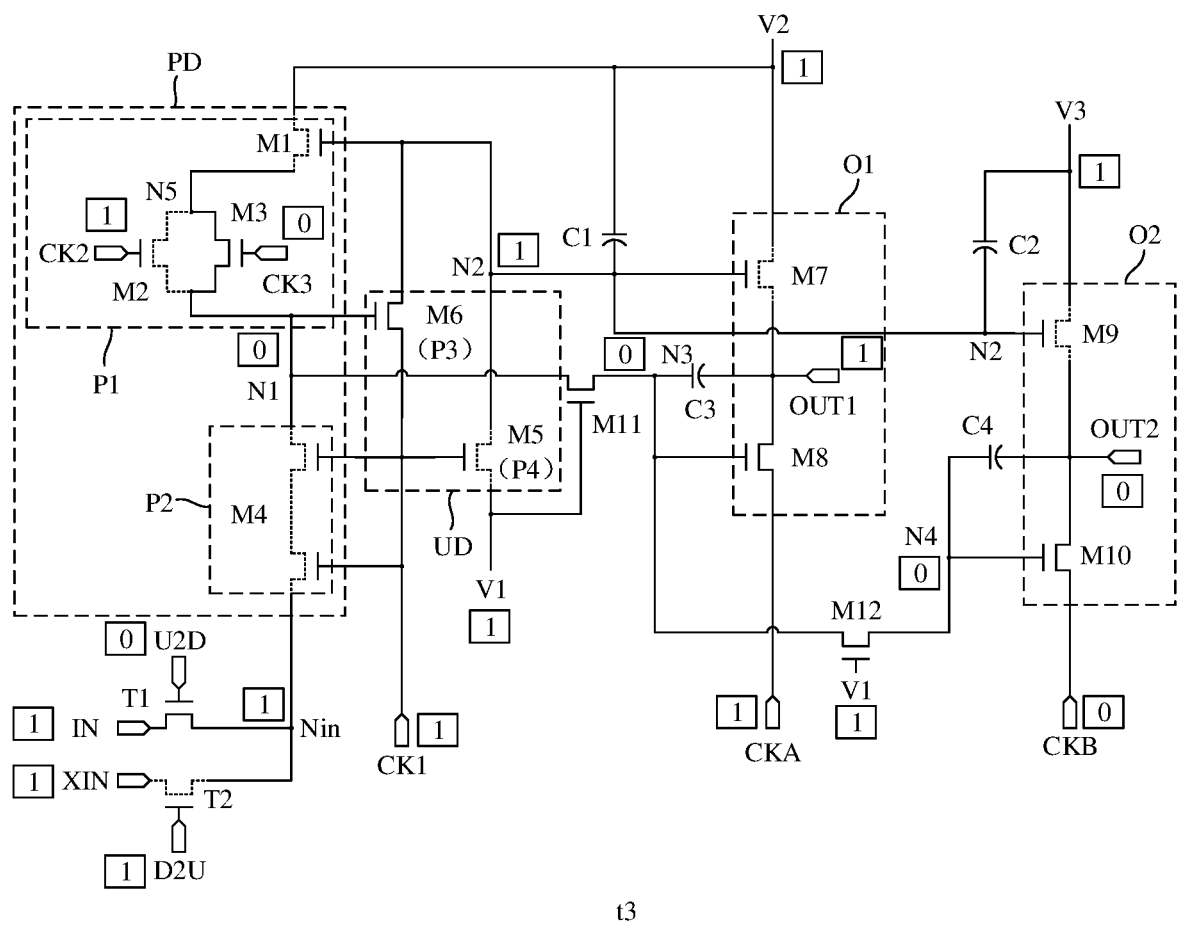
FIG. 14 is a schematic diagram showing a status of a shift register in a t3 period according to an embodiment of the present disclosure.
Figure 15:
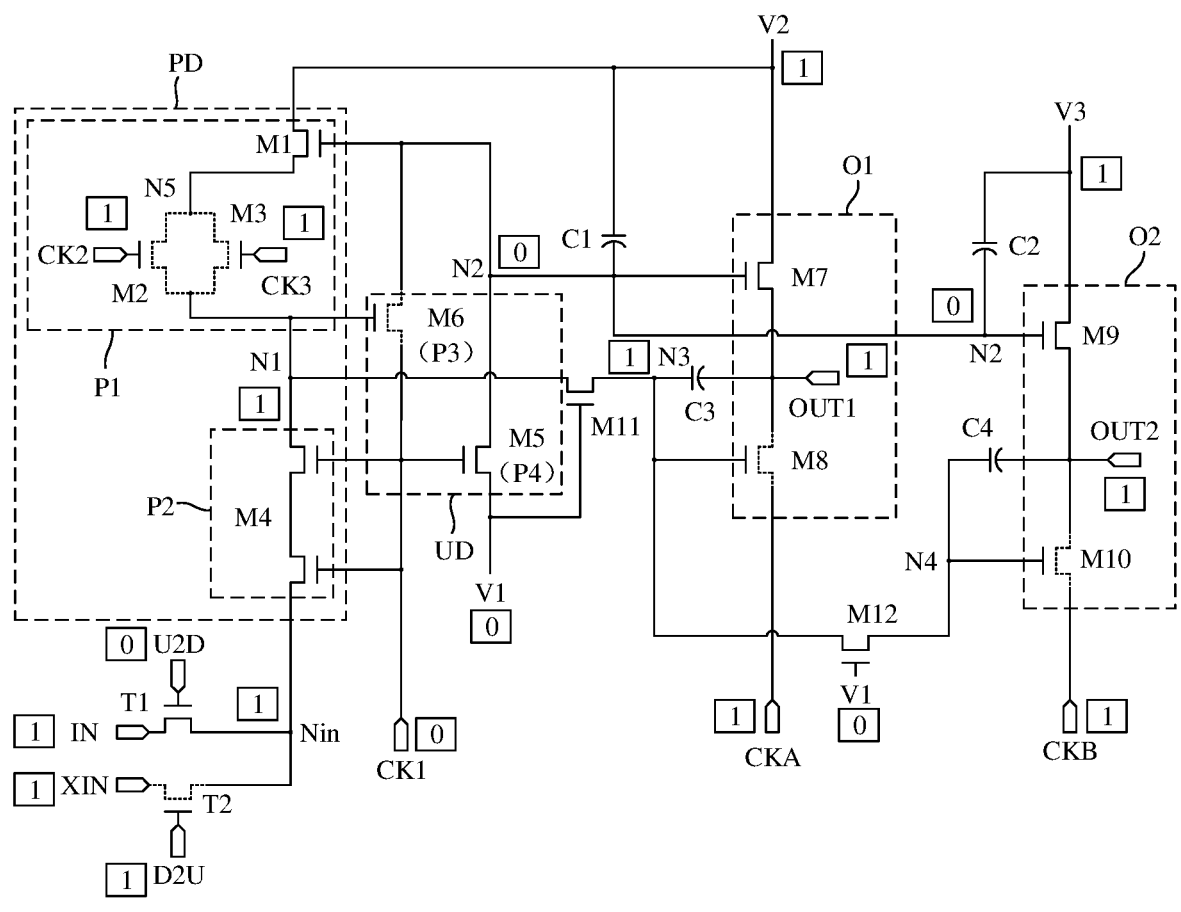
FIG. 15 is a schematic diagram showing a status of a shift register in a t4 period according to an embodiment of the present disclosure.
Figure 16:
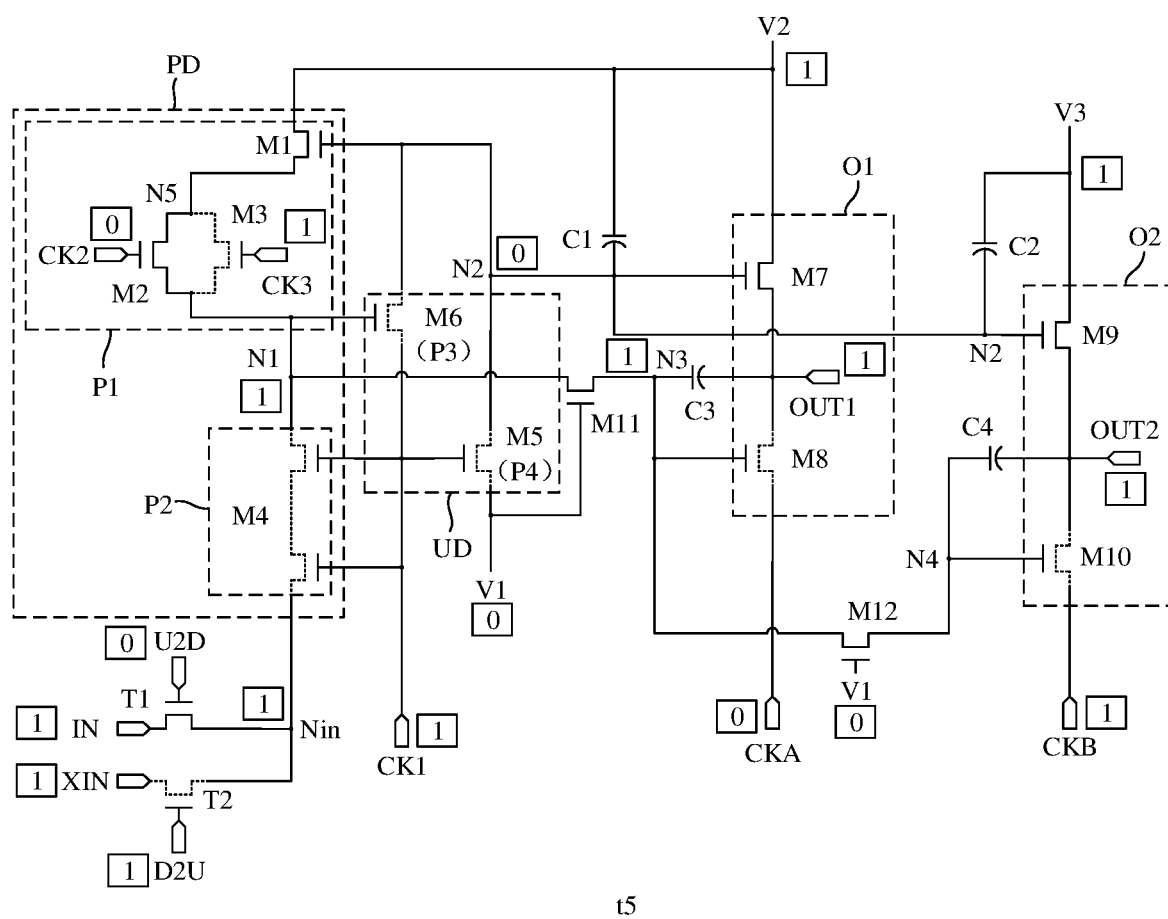
FIG. 16 is a schematic diagram showing a status of a shift register in a t5 period according to an embodiment of the present disclosure.
Figure 17:
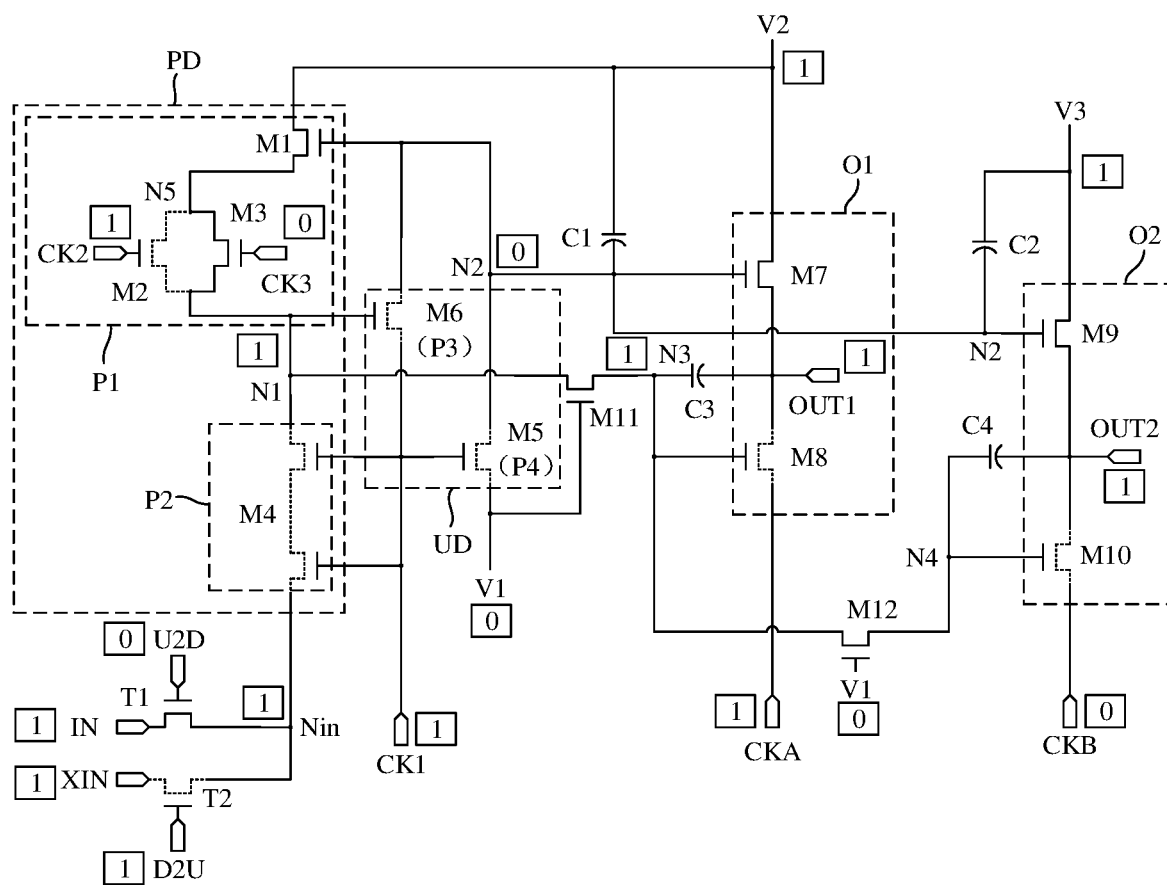
FIG. 17 is a schematic diagram showing a status of a shift register in a t6 period according to an embodiment of the present disclosure.

In an embodiment, each shift register R further includes the first clock signal terminal CK1 configured to provide the first clock signal, the second clock signal terminal CK2 configured to provide the second clock signal, and a third clock signal terminal CK3 configured to provide a third clock signal; the scanning drive circuit further includes a first clock signal line CLK1, a second clock signal line CLK2, a third clock signal line CLK3, a first clock signal output line CLKA, a second clock signal output line CLKB, a third clock signal output line CLKC, a fourth clock signal output line CLKD, a fifth clock signal output line CLKE, a sixth clock signal output line CLKF, a first scanning direction signal line ud1, and a second scanning direction signal line ud2; in a $(3i-2)^{th}$ shift register R, for example, the $1^{st}$ shift register R1, the first clock signal terminal CK1 is electrically connected to the first clock signal line CLK1, the second clock signal terminal CK2 is electrically connected to the second clock signal line CLK2, the third clock signal terminal CK3 is electrically connected to the third clock signal line CLK3, the first clock signal output terminal CKA is electrically connected to the first clock signal output line CLKA, and the second clock signal output terminal CKB is electrically connected to the second clock signal output line CLKB; in a $(3i-1)^{th}$ shift register R, for example the $2^{nd}$ shift register R2, the first clock signal terminal CK1 is electrically connected to the second clock signal line CLK2, the second clock signal terminal CK2 is electrically connected to the third clock signal line CLK3, the third clock signal terminal CK3 is electrically connected to the first clock signal line CLK1, the first clock signal output terminal CKA is electrically connected to the third clock signal output line CLKC, and the second clock signal output terminal CKB is electrically connected to the fourth clock signal output line CLKD; in a $3i^{th}$ shift register R, for example, the $3^{rd}$ shift register R3, the first clock signal terminal CK1 is electrically connected to the third clock signal line CLK3, the second clock signal terminal CK2 is electrically connected to the first clock signal line CLK1, the third clock signal terminal CK3 is electrically connected to the second clock signal line CLK2, the first clock signal output terminal CKA is electrically connected to the fifth clock signal output line CLKE, and the second clock signal output terminal CKB is electrically connected to the sixth clock signal output line CLKF, where i=1, 2, 3, . . . , and n. In any shift register R, a first scanning direction control signal terminal U2D is electrically connected to the first scanning direction signal line ud1, and a second scanning direction control signal terminal D2U is electrically connected to the second scanning direction signal line ud2. In other words, every adjacent three shift registers R define a repeating unit, and all repeating units have a same clock signal connection mode. As shown in FIG. 4, FIG. 10, and FIG. 11, the scanning drive circuit is configured to operate at a forward scanning stage or a reverse scanning stage. As shown in FIG. 10, in each scanning cycle of the forward scanning stage, first output terminals OUT1 of the $1^{st}$ to the $n^{th}$ shift registers R output an effective level successively in an order of 1 to n, and the first output terminal OUT1 and the second output terminal OUT2 of each shift register R output an effective level successively. As shown in FIG. 11, in each scanning cycle of the reverse scanning stage, the first output terminals OUT1 of the $1^{st}$ to $n^{th}$ shift registers R output an effective level successively in an order of n to 1, and the first output terminal OUT1 and the second output terminal OUT2 of the shift register R at each stage output an effective level successively. With the above connections of multiple shift registers connection mode, a same pixel drive circuit can be used to realize the forward scanning and the reverse scanning. Specific scanning processes will be described in detail in the following.

In an embodiment, the fourth transistor M4 is a dual-gate transistor, to reduce a leakage current between the input node Nin and the first node N1, and reduce a probability that the fourth transistor M4 is broken down due to large cross voltage between the first node N1 and the input node Nin.

In an embodiment, taking a p-type transistor as an example, the effective level is a low level, the ineffective level is a high level, the first supply voltage terminal V1 is configured to provide the low level, the second supply voltage terminal V2 is configured to provide the high level, the third supply voltage terminal V3 is configured to provide the high level, and low levels in signals provided by the first to the sixth clock signal output lines (CLKA to CLKF) are lower than the low level provided by the first supply voltage terminal V1. In this way, output stability of the shift register R can be further guaranteed. The principle will be described in detail in the following driving method.

As shown in FIG. 4, FIG. 10, and FIG. 11, an embodiment of the present disclosure further provides a driving method for the scanning drive circuit provided by any one of the above embodiments. The scanning drive circuit is configured to operate at a forward scanning stage or a reverse scanning stage. As shown in FIG. 10, in each scanning cycle of the forward scanning stage, the first output terminals OUT1 of the $1^{st}$ to $n^{th}$ shift registers R output an effective level successively in an order of 1 to n, and the first output terminal OUT1 and the second output terminal OUT2 of each shift register R output an effective level successively. As shown in FIG. 11, in each scanning cycle of the reverse scanning stage, the first output terminals OUT1 of the $1^{st}$ to the $n^{th}$ shift registers R output an effective level successively in an order of n to 1, and the first output terminal OUT1 and the second output terminal OUT2 of each shift register R output an effective level successively.

FIG. 10 shows a timing in the forward scanning stage, and FIG. 11 shows a timing in the reverse scanning stage. In an embodiment, as shown in FIG. 10 and FIG. 11, a high level represents an ineffective level, and a low level represents an effective level. The effective level is a voltage that can control a transistor to be turned on, and the ineffective level is a voltage that can control the transistor to be turned off. In other words, all transistors in this embodiment of the present disclosure can be p-type transistors. In another embodiment, one or more types of signals can also use the low level to represent the ineffective level and the high level to represent the effective level, and in this case, a transistor controlled by the signal is an N-type transistor. In other words, a type of the transistor is not limited in this embodiment of the present disclosure. It can be assumed that all the transistors are p-type transistors, the high level represents the ineffective level, and the low level represents the effective level. As shown in FIG. 4, in each shift register R, the first output OUT1 is electrically connected to a reset scanning line in a corresponding row, and the second output terminal OUT2 is electrically connected to a data writing scanning line in the corresponding row. For example, the first output terminal OUT1 of the $1^{st}$ shift register R1 is electrically connected to a $1^{st}$-row reset scan line S1, and the second output terminal OUT2 of the $1^{st}$ shift register R1 is electrically connected to a $1^{st}$-row data writing scan line SB1; the first output terminal OUT1 of the $2^{nd}$ shift register R2 is electrically connected to a $2^{nd}$-row reset scan line S2, and the second output terminal OUT2 of the $2^{nd}$ shift register R2 is electrically connected to a $2^{nd}$-row data writing scan line SB2; the first output terminal OUT1 of the $3^{rd}$ shift register R3 is electrically connected to a $3^{rd}$-row reset scan line S3, and the second output terminal OUT2 of the $3^{rd}$ shift register R3 is electrically connected to a $3^{rd}$-row data writing scan line SB3; and so on. The reset scanning line is used to control whether a pixel drive circuit in a corresponding row enters a reset stage, and the data writing scan line is used to control whether a pixel drive circuit in a corresponding row enters a data writing state. A reset circuit of each pixel drive circuit is electrically connected to a reset scan line in a corresponding row, and a data writing circuit of each pixel drive circuit is electrically connected to a data writing scan line in a corresponding row. In the forward scanning stage, the scanning drive circuit drives a pixel drive circuit in each row to perform refreshing from top to bottom. That is, in time of one frame, for example, in a second forward scanning period t2, the first output terminal OUT1 of the $1^{st}$ shift register R1 in the scanning drive circuit outputs an effective level to the $1^{st}$-row reset scan line S1, and controls the pixel drive circuits in the $1^{st}$-row of pixel drive circuits to enter the reset stage. In a third forward scanning period t3, the second output terminal OUT2 of the $1^{st}$ shift register R1 outputs an effective level to the $1^{st}$-row data writing scan line SB1, and controls the pixel drive circuits in the $1^{st}$-row of pixel drive circuits to enter the data writing stage, and the first output terminal OUT1 of the $2^{nd}$ shift register R2 outputs an effective level to the $2^{nd}$-row reset scan line S2, and controls the pixel drive circuits in a $2^{nd}$-row of pixel drive circuits to enter the reset stage. In a fourth forward scanning period t4, the second output terminal OUT2 of the $2^{nd}$ shift register R2 outputs an effective level to the $2^{nd}$-row data writing scan line SB2, and controls the pixel drive circuits in the $2^{nd}$-row of pixel drive circuits to enter the data writing stage, and the first output terminal OUT1 of the $3^{rd}$ shift register R3 outputs an effective level to the $3^{rd}$-row reset scan line S3, and controls the pixel drive circuits in a $3^{rd}$-row of pixel drive circuits to enter the reset stage. In a fifth forward scanning period t5, the second output terminal OUT2 of the $3^{rd}$ shift register R3 outputs an effective level to the $3^{rd}$-row data writing scan line SB3, and controls the pixel drive circuits in the $3^{rd}$-row of pixel drive circuits to enter the data writing stage. The rest can be deduced by analogy. In this way, forward scan can be realized. In the reverse scanning stage, the scanning drive circuit drives the pixel drive circuit in each row to perform refreshing from bottom to top. That is, in time of one frame, for example, in a second reverse scanning period t2', the first output terminal OUT1 of the $3^{rd}$ shift register R3 in the scanning drive circuit outputs an effective level to the $3^{rd}$-row reset scan line S3, and controls the pixel drive circuits in the $3^{rd}$-row of pixel drive circuits to enter the reset stage. In a third reverse scanning period t3', the second output terminal OUT2 of the $3^{rd}$ shift register R3 outputs an effective level to the $3^{rd}$-row data writing scan line SB3, and controls the pixel drive circuits in the $3^{rd}$-row of pixel drive circuits to enter the data writing stage, and the first output terminal OUT1 of the $2^{nd}$ shift register R2 outputs an effective level to the $2^{nd}$-row reset scan line S2, and controls the pixel drive circuits in the $2^{nd}$-row of pixel drive circuits to enter the reset stage. In a fourth reverse scanning period t4', the second output terminal OUT2 of the $2^{nd}$ shift register R2 outputs an effective level to the $2^{nd}$-row data writing scan line SB2, and controls the pixel drive circuits in the $2^{nd}$-row of pixel drive circuits to enter the data writing stage, and the first output terminal OUT1 of the $1^{st}$ shift register R1 outputs an effective level to the $1^{st}$-row reset scan line S1, and controls the pixel drive circuits in the $1^{st}$-row of pixel drive circuits to enter the reset stage. In a fifth forward scanning period t5', the second output terminal OUT2 of the $1^{st}$ shift register R1 outputs an effective level to the $1^{st}$-row data writing scan line SB1, and controls the pixel drive circuits in the $1^{st}$-row of pixel drive circuits to enter the data writing stage. The rest can be deduced by analogy. In this way, reverse scan can be realized.

According to the driving method in an embodiment of the present disclosure, each shift register R in a corresponding scanning drive circuit has the first output terminal OUT1 and second output terminal OUT2 that are independent from each other, and the first output terminal OUT1 and the second output terminal OUT2 output the effective level successively. In a process in which the first output terminals OUT1 of the $1^{st}$ to the $n^{th}$ shift registers R output the effective level successively, it can be ensured that the second output terminal OUT2 of each shift register R outputs the effective level after an adjacent period. In a process in which the first output terminals OUT1 of the $n^{th}$ to the $1^{st}$ shift registers R output the effective level successively, it can also be ensured that the second output terminal OUT2 of each shift register R outputs the effective level after an adjacent period. In this way, a same scanning drive circuit can be used to realize the forward scanning and the reverse scanning of the pixel drive circuit, and ensure driving control over the pixel drive circuit. Compared with the related art, the driving method reduces the occupied space and facilitates design of a narrow bezel because no additional scanning drive circuit is provided.

As shown in FIG. 4, FIG. 10, and FIG. 1I, an embodiment of the present disclosure further provides a driving method for the scanning drive circuit provided by any one of the above embodiments. The scanning drive circuit is used at a forward scanning stage or a reverse scanning stage. As shown in FIG. 10, each scanning cycle of the forward scanning stage includes a first forward scanning period t1, a second forward scanning period t2, and a third forward scanning period t3 that are arranged in sequence. In the first forward scanning period t1, the second forward scanning period t2, and the third forward scanning period t3, the first clock signal line CLK1, the second clock signal line CLK2, and the third clock signal line CLK3 provide an effective level successively. In the first forward scanning period t1, the second forward scanning period t2, and the third forward scanning period t3, a signal line group constituted by the fourth clock signal output line CLKD and the fifth clock signal output line CLKE, a signal line group constituted by the first clock signal output line CLKA and the sixth clock signal output line CLKF, and a signal line group constituted by the second clock signal output line CLKB and the third clock signal output line CLKC provide an effective level successively.

In an embodiment, based on the circuit structures shown in FIG. 3 and FIG. 4, every three adjacent shift registers R define a repeating unit to cooperate with timings sequence of the above clock signal lines. For example, in the first forward scanning period t1, when the first input terminal IN of the $1^{st}$ shift register R1 provides an effective level, the effective level of the first input terminal IN of the $1^{st}$ shift register R1 can be shifted by using the $1^{st}$ shift register R1.

In an embodiment, as shown in FIG. 11, each scanning cycle of the reverse scanning stage includes a first reverse scanning period t1', a second reverse scanning period t2', and a third reverse scanning period t3' successively. In the first reverse scanning period t1', the second reverse scanning period t2', and the third reverse period t3', the third clock signal line CLK3, the second clock signal line CLK2, and the third clock signal line CLK3 provide an effective level successively. In the first reverse scanning period t1', the second reverse scanning period t2', and the third reverse scanning period t3', a signal line group defined by the first clock signal output line CLKA and the fourth clock signal output line CLKD, a signal line group defined by the second clock signal output line CLKB and the fifth clock signal output line CLKE, and a signal line group defined by the third clock signal output line CLKC and the sixth clock signal output line CLKF provide an effective level successively.

In an embodiment, during the forward scanning and the reverse scanning, signal timings of the first clock signal line CLK1 and the third clock signal line CLK3 are exchanged, signal timings of the first clock signal output line CLKA and the fifth clock signal output line CLKE are exchanged, and signal timings of the second clock signal output line CLKB and the sixth clock signal output line CLKF are exchanged, which can realize switching between the forward scanning and the reverse scanning.

In an embodiment, as shown in FIG. 4 and FIG. 10 to FIG. 17, each scanning cycle of the forward scanning stage includes the first forward scanning period t1, the second forward scanning period t2, the third forward scanning period t3, a fourth forward scanning period t4, a fifth forward scanning period t5, and a sixth forward scanning period t6 successively. In the forward scanning stage, the first scanning direction signal line ud1 provides an effective level, and the second scanning direction signal line ud2 provides an ineffective level. In FIG. 12 to FIG. 17, 0 in the rectangle represents the effective level, 1 in the rectangle represents the ineffective level, the transistor represented by a dotted line is in a turn-off state, and the transistor represented by a solid line is in a turn-on state.

In the first forward scanning period t1, the first clock signal line CLK1, the fourth clock signal output line CLKD, and the fifth clock signal output line CLKE each provide an effective level, and the second clock signal line CKL2, the third clock signal line CLK3, the first clock signal output line CLKA, the second clock signal output line CLKB, the third clock signal output line CLKC, and the sixth clock signal output line CLKF each provide an ineffective level. In an $m^{th}$ shift register, $1 \leq m \leq n-2$, the pull-down unit PD outputs an effective level to the first node N1 based on the effective level provided by the first clock signal terminal CK1, the first node N1 transmits the effective level to the third node N3 and the fourth node N4, the pull-up unit UD outputs an effective level to the second node N2 based on the effective level provided by the first clock signal terminal CK1, and the first output unit O1 and the second output unit O2 output ineffective levels to the first output terminal OUT1 and the second output terminal OUT2 based on the effective levels of the second node N2, the third node N3, and the fourth node N4.

For example, for the $1^{st}$ shift register R1, an effective level provided by the first scanning direction control signal terminal U2D controls turn-on of the first input transistor T1, and an ineffective level provided by the second scanning direction control signal terminal D2U controls turn-off of the second input transistor T2. The first input terminal IN provides an effective level, and the effective level is transmitted to the input node Nin by using the first input transistor T1 that is turned on. The effective level of the first clock signal terminal CK1 (the first clock signal line CLK1) controls turn-on of the fourth transistor M4 and the fifth transistor M5, in other words, turn-on of the second transmission unit P2 in the pull-down unit PD and the fourth transmission unit P4 in the pull-up unit UD. The second transmission unit P2 (the fourth transistor M4) transmits the effective level of the input node Nin to the first node N1, the first node N1 transmits the effective level to the third node N3, and the third node N3 transmits the effective level to the fourth node N4. The fourth transmission unit P4 (the fifth transistor M5) transmits an effective level of the first supply voltage terminal V1 to the second node N2. The ineffective level provided by the second clock signal terminal CK2 (the second clock signal line CLK2) controls turn-off of the second transistor M2. The ineffective level provided by the third clock signal terminal CK3 (the third clock signal line CLK3) controls turn-off of the third transistor M3. The effective level of the second node N2 controls turn-on of the first transistor M1. In other words, the first transmission unit P1 is turned off. The effective level of the first node N1 controls turn-on of the third transmission unit P3 (the sixth transistor M6), so that the effective level provided by the first clock signal terminal CK1 is transmitted to the second node N2 by using the third transmission unit P3. The effective level of the second node N2 controls turn-on of the seventh transistor M7 and the ninth transistor M9. An ineffective level provided by the second supply voltage terminal V2 is transmitted to the first output terminal OUT1 by using the seventh transistor M7 of the first output unit O1. An ineffective level provided by the third supply voltage terminal V3 is transmitted to the second output terminal OUT2 by using the ninth transistor M9 of the second output unit O2. The effective level of the third node N3 controls turn-on of the eighth transistor M8, so that the ineffective level provided by the first clock signal output terminal CKA (the first clock signal output line CLKA) is transmitted to the first output terminal OUT1 by using the eighth transistor M8 of the first output unit O1. The effective level of the fourth node N4 controls turn-on of the tenth transistor M10, so that the ineffective level provided by the second clock signal output terminal CKB (the second clock signal output line CLKB) is transmitted to the second output terminal OUT2 by using the tenth transistor M10 of the second output unit O2.

In the second forward scanning period t2, the second clock signal line CLK2, the first clock signal output line CLKA, and the sixth clock signal output line CLKF each provide an effective level, and the first clock signal line CLK1, the third clock signal line CLK3, the second clock signal output line CLKB, the third clock signal output line CLKC, the fourth clock signal output line CLKD, and the fifth clock signal output line CLKE each provide an ineffective level. In the $m^{th}$ shift register R, the pull-down unit PD is turned off, the first node N1 maintains an effective level, the pull-up unit UD transmits, to the second node N2 based on the effective level of the first node N1, the ineffective level provided by the first clock signal terminal CK1, the first output unit O1 transmits the effective level of the first clock signal output terminal CKA to the first output terminal OUT1 based on an effective level of the third node N3 and the ineffective level of the second node N2, and the second output unit O2 transmits the ineffective level of the second clock signal output terminal CKB to the second output terminal OUT2 based on an effective level of the fourth node N4 and the ineffective level of the second node N2.

For example, for the $1^{st}$ shift register R1, an effective level provided by the first scanning direction control signal terminal U2D controls turn-on of the first input transistor T1, and an ineffective level provided by the second scanning direction control signal terminal D2U controls turn-off of the second input transistor T2. The ineffective level of the first clock signal terminal CK1 (the first clock signal line CLK1) controls turn-off of the fourth transistor M4 and the fifth transistor M5, in other words, turn-off of the second transmission unit P2 in the pull-down unit PD and the fourth transmission unit P4 in the pull-up unit UD. The first node N1 maintains an effective level in a previous period and transmits the effective level to the first node N3, and the third node N3 transmits the effective level to the fourth node N4. The effective level provided by the second clock signal terminal CK2 (the second clock signal line CLK2) controls turn-on of the second transistor M2. The ineffective level provided by the third clock signal terminal CK3 (the third clock signal line CLK3) controls turn-off of the third transistor M3. The effective level of the first node N1 controls turn-on of the third transmission unit P3 (the sixth transistor M6), so that the ineffective level provided by the first clock signal terminal CK1 is transmitted to the second node N2 by using the third transmission unit P3. The ineffective level of the second node N2 controls turn-off of the first transistor M1, in other words, both the first transmission unit P1 and the second transmission unit P2 are turned off. The ineffective level of the second node N2 controls turn-off of the seventh transistor M7 and the ninth transistor M9. The effective level of the third node N3 controls turn-on of the eighth transistor M8, so that the effective level provided by the first clock signal output terminal CKA (the first clock signal output line CLKA) is transmitted to the first output terminal OUT1 by using the eighth transistor M8 of the first output unit O1. The effective level of the fourth node N4 controls turn-on of the tenth transistor M10, so that the ineffective level provided by the second clock signal output terminal CKB (the second clock signal output line CLKB) is transmitted to the second output terminal OUT2 by using the tenth transistor M10 of the second output unit O2. It should be additionally noted that the first node N1, the third node N3, and the fourth node N4 maintain the effective level. In fact, the potential of the first output terminal OUT1 changes from the ineffective level in the previous period to the effective level, for example, from the high level to the low level. In this way, affected by the third capacitor C3, potentials of the third node N3 and the fourth node N4 are further decreased (to lower effective levels) to ensure an output effect.

In the third forward scanning period t3, the third clock signal line CLK3, the second clock signal output line CLKB, and the third clock signal output line CLKC each provide an effective level, and the first clock signal line CLK1, the second clock signal line CLK2, the first clock signal output line CLKA, the fourth clock signal output line CLKD, the fifth clock signal output line CLKE, and the sixth clock signal output line CLKF each provide an ineffective level. In the $m^{th}$ shift register R, the pull-down unit PD is turned off, the first node N1 maintains an effective level, the pull-up unit UD transmits, to the second node N2 based on the effective level of the first node N1, the ineffective level provided by the first clock signal terminal CK1, the first output unit O1 transmits the ineffective level of the first clock signal output terminal CKA to the first output terminal OUT1 based on an effective level of the third node N3 and the ineffective level of the second node N2, and the second output unit O2 transmits the effective level of the second clock signal output terminal CKB to the second output terminal OUT2 based on an effective level of the fourth node N4 and the ineffective level of the second node N2.

For example, for the $1^{st}$ shift register R1, an effective level provided by the first scanning direction control signal terminal U2D controls turn-on of the first input transistor T1, and an ineffective level provided by the second scanning direction control signal terminal D2U controls turn-off of the second input transistor T2. The ineffective level of the first clock signal terminal CK1 (the first clock signal line CLK1) controls turn-off of the fourth transistor M4 and the fifth transistor M5, in other words, turn-off of the second transmission unit P2 in the pull-down unit PD and the fourth transmission unit P4 in the pull-up unit UD. The first node N1 maintains an effective level in a previous period and transmits the effective level to the third node N3, and the third node N3 transmits the effective level to the fourth node N4. The ineffective level provided by the second clock signal terminal CK2 (the second clock signal line CLK2) controls turn-off of the second transistor M2. The effective level provided by the third clock signal terminal CK3 (the third clock signal line CLK3) controls turn-on of the third transistor M3. The effective level of the first node N1 controls turn-on of the third transmission unit P3 (the sixth transistor M6), so that the ineffective level provided by the first clock signal terminal CK1 is transmitted to the second node N2 by using the third transmission unit P3. The ineffective level of the second node N2 controls turn-off of the first transistor M1, in other words, both the first transmission unit P1 and the second transmission unit P2 are turned off. The ineffective level of the second node N2 controls turn-off of the seventh transistor M7 and the ninth transistor M9. The effective level of the third node N3 controls turn-on of the eighth transistor M8, so that the ineffective level provided by the first clock signal output terminal CKA (the first clock signal output line CLKA) is transmitted to the first output terminal OUT1 by using the eighth transistor M8 of the first output unit O1. The effective level of the fourth node N4 controls turn-on of the tenth transistor M10, so that the effective level provided by the second clock signal output terminal CKB (the second clock signal output line CLKB) is transmitted to the second output terminal OUT2 by using the tenth transistor M10 of the second output unit O2. It should be additionally noted that the first node N1, the third node N3, and the fourth node N4 maintain the effective level. In fact, the potential of the second output terminal OUT2 changes from the ineffective level in the previous period to the effective level, for example, from the high level to the low level. In this way, affected by the fourth capacitor C4, potentials of the third node N3 and the fourth node N4 are further decreased (to lower effective levels) to ensure the output effect.

In the fourth forward scanning period t4, the first clock signal line CLK1, the fourth clock signal output line CLKD, and the fifth clock signal output line CLKE each provide an effective level, and the second clock signal line CLK2, the third clock signal line CLK3, the first clock signal output line CLKA, the second clock signal output line CLKB, the third clock signal output line CLKC, and the sixth clock signal output line CLKF each provide an ineffective level. In the $m^{th}$ shift register R, the pull-down unit PD outputs an ineffective level to the first node N1 based on the effective level provided by the first clock signal terminal CK1, the first node N1 transmits the ineffective level to the third node N3 and the fourth node N4, the pull-up unit UD outputs an effective level to the second node N2 based on the effective level provided by the first clock signal terminal CK1, the first output unit O1 outputs an ineffective level to the first output terminal OUT1 based on the effective level of the second node N2 and the ineffective level of the third node N3, and the second output unit O2 outputs an ineffective level to the second output terminal OUT2 based on the effective level of the second node N2 and the ineffective level of the fourth node N4.

For example, for the $1^{st}$ shift register R1, an effective level provided by the first scanning direction control signal terminal U2D controls turn-on of the first input transistor T1, and an ineffective level provided by the second scanning direction control signal terminal D2U controls turn-off of the second input transistor T2. The first input terminal IN provides an ineffective level, and the ineffective level is transmitted to the input node Nin by using the first input transistor T1 that is turned on. The effective level of the first clock signal terminal CK1 (the first clock signal line CLK1) controls turn-on of the fourth transistor M4 and the fifth transistor M5, in other words, turn-on of the second transmission unit P2 in the pull-down unit PD and the fourth transmission unit P4 in the pull-up unit UD. The second transmission unit P2 (the fourth transistor M4) transmits the ineffective level of the input node Nin to the first node N1, the first node N1 transmits the ineffective level to the third node N3, and the third node N3 transmits the ineffective level to the fourth node N4. The fourth transmission unit P4 (the fifth transistor M5) transmits an effective level of the first supply voltage terminal V1 to the second node N2. The ineffective level provided by the second clock signal terminal CK2 (the second clock signal line CLK2) controls turn-off of the second transistor M2. The ineffective level provided by the third clock signal terminal CK3 (the third clock signal line CLK3) controls turn-off of the third transistor M3. The effective level of the second node N2 controls turn-on of the first transistor M1. In other words, the first transmission unit P1 is turned off. The ineffective level of the first node N1 controls turn-off of the third transmission unit P3 (the sixth transistor M6). The effective level of the second node N2 controls turn-on of the seventh transistor M7 and the ninth transistor M9. An ineffective level provided by the second supply voltage terminal V2 is transmitted to the first output terminal OUT1 by using the seventh transistor M7 of the first output unit O1. An ineffective level provided by the third supply voltage terminal V3 is transmitted to the second output terminal OUT2 by using the ninth transistor M9 of the second output unit O2. The ineffective level of the third node N3 controls turn-off of the eighth transistor M8. An effective level of the fourth node N4 controls turn-off of the tenth transistor M10.

In the fifth forward scanning period t5, the second clock signal line CLK2, the first clock signal output line CLKA, and the sixth clock signal output line CLKF each provide an effective level, and the first clock signal line CLK1, the third clock signal line CLK3, the second clock signal output line CLKB, the third clock signal output line CLKC, the fourth clock signal output line CLKD, and the fifth clock signal output line CLKE each provide an ineffective level. In the $m^{th}$ shift register R, the pull-down unit PD transmits an ineffective level of the second supply voltage terminal V2 to the first node N1 based on the effective level of the second clock signal terminal CK2 and an effective level of the second node N2, the first node N1, the third node N3, and the fourth node N4 each maintain an ineffective level, the pull-up unit UD is turned off, the second node N2 maintains the effective level, the first output unit O1 transmits the ineffective level of the second supply voltage terminal V2 to the first output terminal OUT1 based on the ineffective level of the third node N3 and the effective level of the second node N2, and the second output unit O2 transmits an ineffective level of the third supply voltage terminal V3 to the second output terminal OUT2 based on the ineffective level of the fourth node N4 and the effective level of the second node N2.

For example, for the $1^{st}$ shift register R1, an effective level provided by the first scanning direction control signal terminal U2D controls turn-on of the first input transistor T1, and an ineffective level provided by the second scanning direction control signal terminal D2U controls turn-off of the second input transistor T2. The ineffective level of the first clock signal terminal CK1 (the first clock signal line CLK1) controls turn-off of the fourth transistor M4 and the fifth transistor M5, in other words, turn-off of the second transmission unit P2 in the pull-down unit PD and the fourth transmission unit P4 in the pull-up unit UD. The effective level provided by the second clock signal terminal CK2 (the second clock signal line CLK2) controls turn-on of the second transistor M2. The ineffective level provided by the third clock signal terminal CK3 (the third clock signal line CLK3) controls turn-off of the third transistor M3. The second node N2 maintains an effective level in a previous period and controls turn-on of the first transistor M1, in other words, the first transmission unit P1 is turned on and the second transmission unit P2 is turned off. The ineffective level provided by the second supply voltage terminal V2 is transmitted to the first node N1 by using the first transistor M1 and the second transistor M2 of the first transmission unit P1. The ineffective level of the first node N1 controls turn-off of the third transmission unit P3 (the sixth transistor M6). The ineffective level of the first node N1 is transmitted to the third node N3, and the third node N3 transmits the ineffective level to the fourth node N4. The effective level of the second node N2 controls turn-on of the seventh transistor M7, so that the ineffective level of the second supply voltage terminal V2 is transmitted to the first output terminal OUT1 by using the seventh transistor M7 of the first output unit O1. The effective level of the second node N2 controls turn-on of the ninth transistor M9, so that the ineffective level of the third supply voltage terminal V3 is transmitted to the second output terminal OUT2 by using the ninth transistor M9 of the second output unit O2. The ineffective level of the third node N3 controls turn-off of the eighth transistor M8. The ineffective level of the fourth node N4 controls turn-off of the tenth transistor M10.

In the sixth forward scanning period t6, the third clock signal line CLK3, the second clock signal output line CLKB, and the third clock signal output line CLKC each provide an effective level, and the first clock signal line CLK1, the second clock signal line CLK2, the first clock signal output line CLKA, the fourth clock signal output line CLKD, the fifth clock signal output line CLKE, and the sixth clock signal output line CLKF each provide an ineffective level. In the $m^{th}$ shift register R, the pull-down unit PD transmits an ineffective level of the second supply voltage terminal V2 to the first node N1 based on the effective level of the third clock signal terminal CK3 and an effective level of the second node N2, the first node N1, the third node N3, and the fourth node N4 each maintain an ineffective level, the pull-up unit UD is turned off, the second node N2 maintains the effective level, the first output unit O1 transmits the ineffective level of the second supply voltage terminal V2 to the first output terminal OUT1 based on the ineffective level of the third node N3 and the effective level of the second node N2, and the second output unit O2 transmits an ineffective level of the third supply voltage terminal V3 to the second output terminal OUT2 based on the ineffective level of the fourth node N4 and the effective level of the second node N2.

For example, for the $1^{st}$ shift register R1, an effective level provided by the first scanning direction control signal terminal U2D controls turn-on of the first input transistor T1, and an ineffective level provided by the second scanning direction control signal terminal D2U controls turn-off of the second input transistor T2. The ineffective level of the first clock signal terminal CK1 (the first clock signal line CLK1) controls turn-off of the fourth transistor M4 and the fifth transistor M5, in other words, turn-off of the second transmission unit P2 in the pull-down unit PD and the fourth transmission unit P4 in the pull-up unit UD. The ineffective level provided by the second clock signal terminal CK2 (the second clock signal line CLK2) controls turn-off of the second transistor M2. The effective level provided by the third clock signal terminal CK3 (the third clock signal line CLK3) controls turn-on of the third transistor M3. The second node N2 maintains the effective level and controls turn-on of the first transistor M1, the seventh transistor M7, and the ninth transistor M9, so that the ineffective level of the second supply voltage terminal V2 is transmitted to the first output terminal OUT1 by using the seventh transistor M7, and the ineffective level of the third supply voltage terminal V3 is transmitted to the second output terminal OUT2 by using the ninth transistor M9. The ineffective level of the second supply voltage terminal V2 is transmitted to the first node N1 by using the first transistor M1 and the third transistor M3. The first node N1 transmits the ineffective level to the third node N3, and the third node N3 transmits the ineffective level to the fourth node N4. The ineffective level of the first node N1 controls turn-off of the third transmission unit P3 (the sixth transistor M6). The ineffective level of the third node N3 controls turn-off of the eighth transistor M8. The ineffective level of the fourth node N4 controls turn-off of the tenth transistor M10.

For the 1S shift register R1, the effective level of the first input terminal IN is shifted in the t1, t2, and t3 periods. The first output terminal OUT1 transmits the shifted effective level to the $2^{nd}$ shift register R2 as an input signal of a next shift register. The $1^{st}$ shift register R1 maintains output of the ineffective level in the t4, t5, and t6 periods. Specifically, the $1^{st}$ shift register R1 repeats the control processes in the t4, t5, and t6 periods before an effective level of the input terminal arrives next time, to maintain output of the ineffective level. Other shift registers have the same control processes. Different shift registers shift an effective level in an input signal from a previous shift register R2 at different time, to realize forward scan, to be specific, to provide an effective level to the reset scan line of each row successively from front to back, and provide an effective level to the data writing scan line of each row successively from front to back. In addition, for the reset scan line and the data writing scan line in a same row, an effective level of the reset scan line is before an effective level of the data writing scan line, to drive screen refreshing from front to back.

In an embodiment, in the periods of t5 and t6, the second transistor M2 and the third transistor M3 are alternately turned on based on the timings of the second clock signal terminal CK2 and the third clock signal terminal CK3, so that the ineffective level of the second supply voltage terminal V2 is transmitted to the first node N1. In this way, it can be ensured that the potential of the first node N1 maintains at the ineffective level in all periods in which output of the ineffective level needs to be maintained, to further ensure output stability. In an entire working process of the circuit, because the first output terminal OUT1 outputs the high level for a long time, the eighth transistor M8 is affected by transconductance for a long time. As a result, a threshold voltage of the eighth transistor M8 is easily drifted. If the third node N3 does not maintain the high level stably, the eighth transistor M8 is easy to produce a leakage current. However, this problem does not occur in a traditional scanning circuit because there is only one output terminal. In an embodiment of the present disclosure, the first output terminal OUT1 and the second output terminal OUT2 of each shift register can output shift signals at different time. Therefore, two separate transistors can be turned on in turn only in the t5 and t6 periods in which the two output terminals maintain the high level, to ensure that the third node N3 maintains the high level, to avoid current leakage caused by a failure to maintain the high level of the third node N3.

Figure 18:
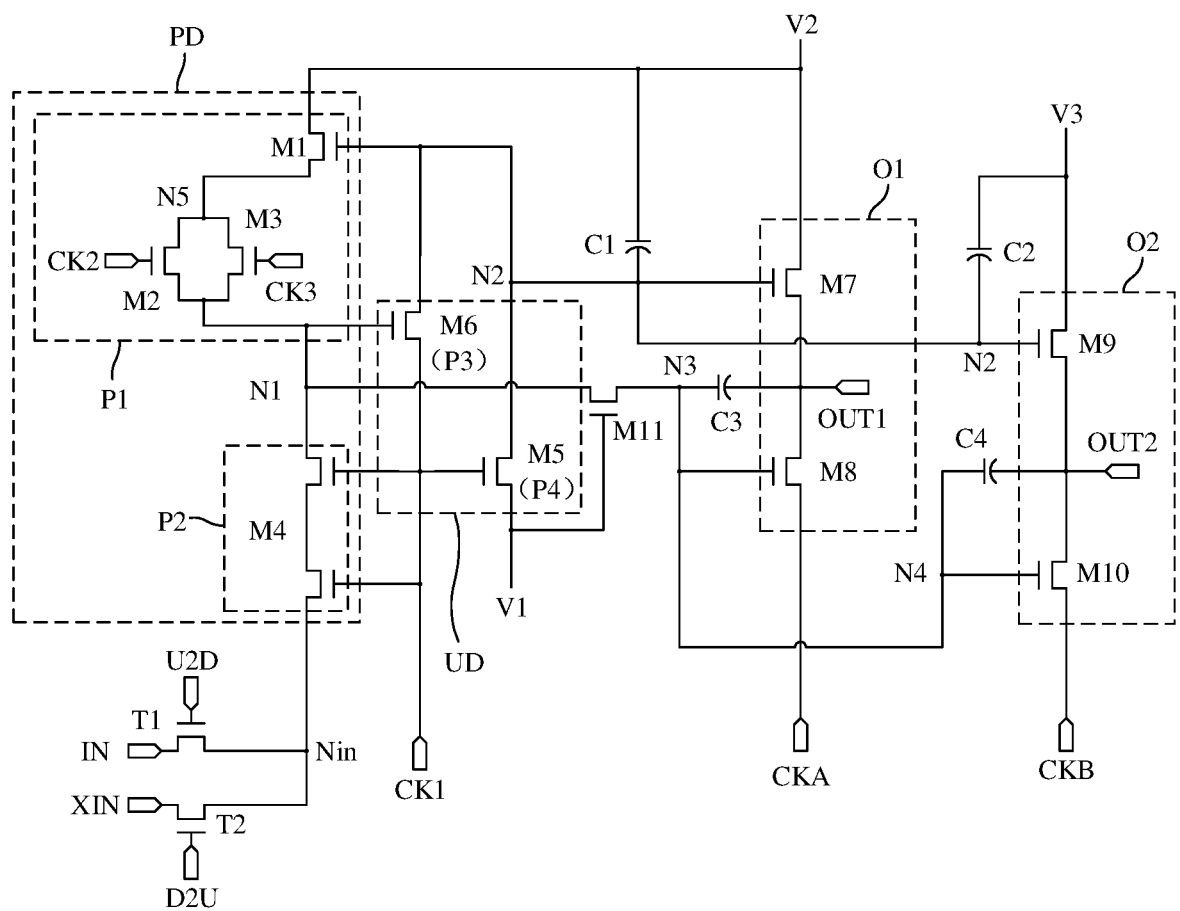
FIG. 18 is a schematic diagram of a circuit structure of another shift register according to an embodiment of the present disclosure.
Figure 19:
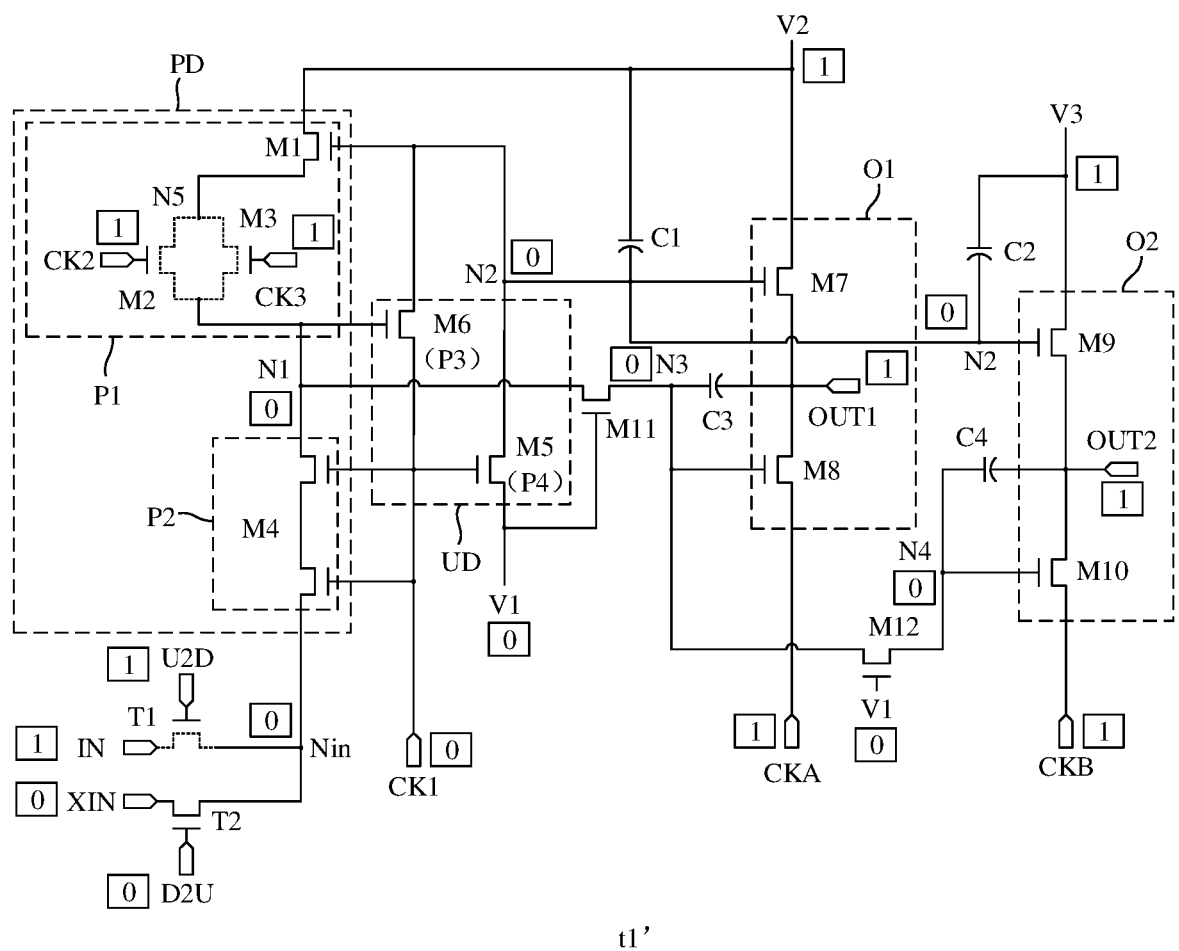
FIG. 19 is a schematic diagram showing a status of a shift register in a t1' period according to an embodiment of the present disclosure.
Figure 20:
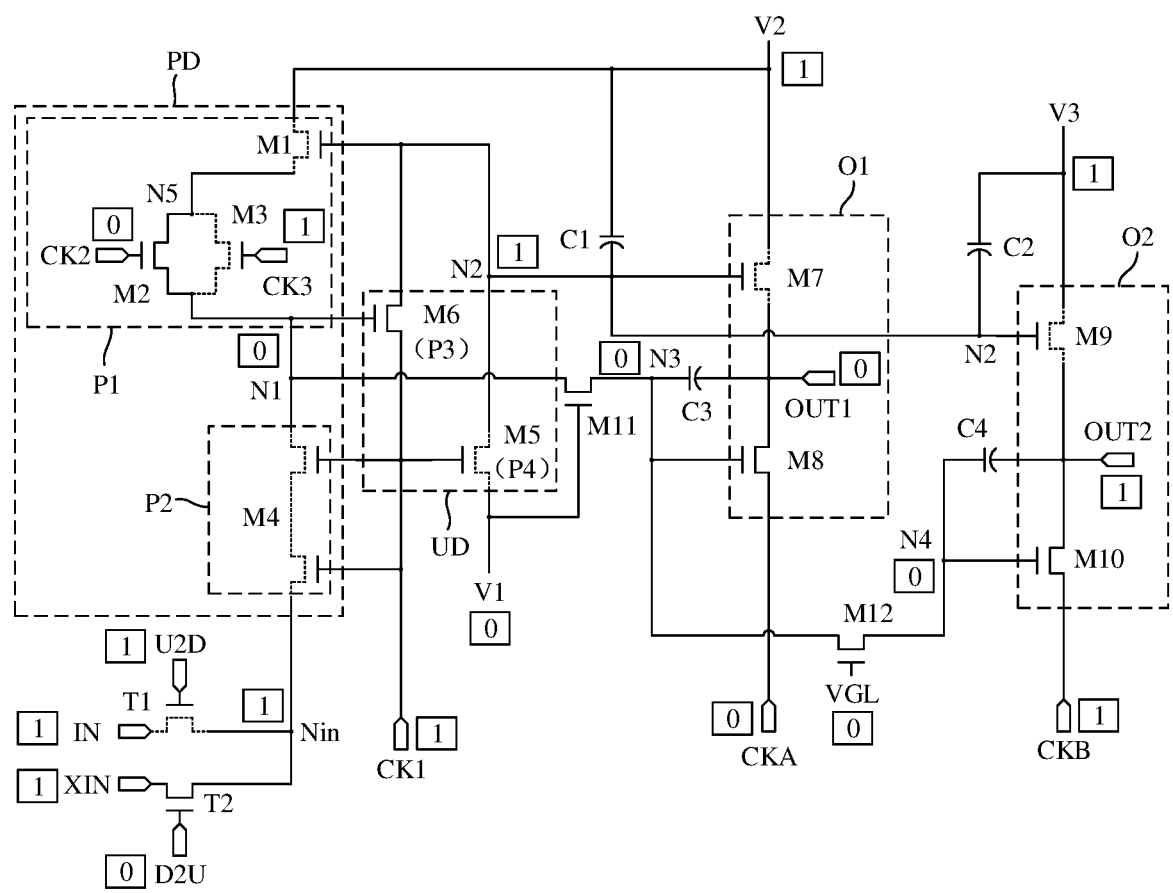
FIG. 20 is a schematic diagram showing a status of a shift register in a t2' period according to an embodiment of the present disclosure.
Figure 21:
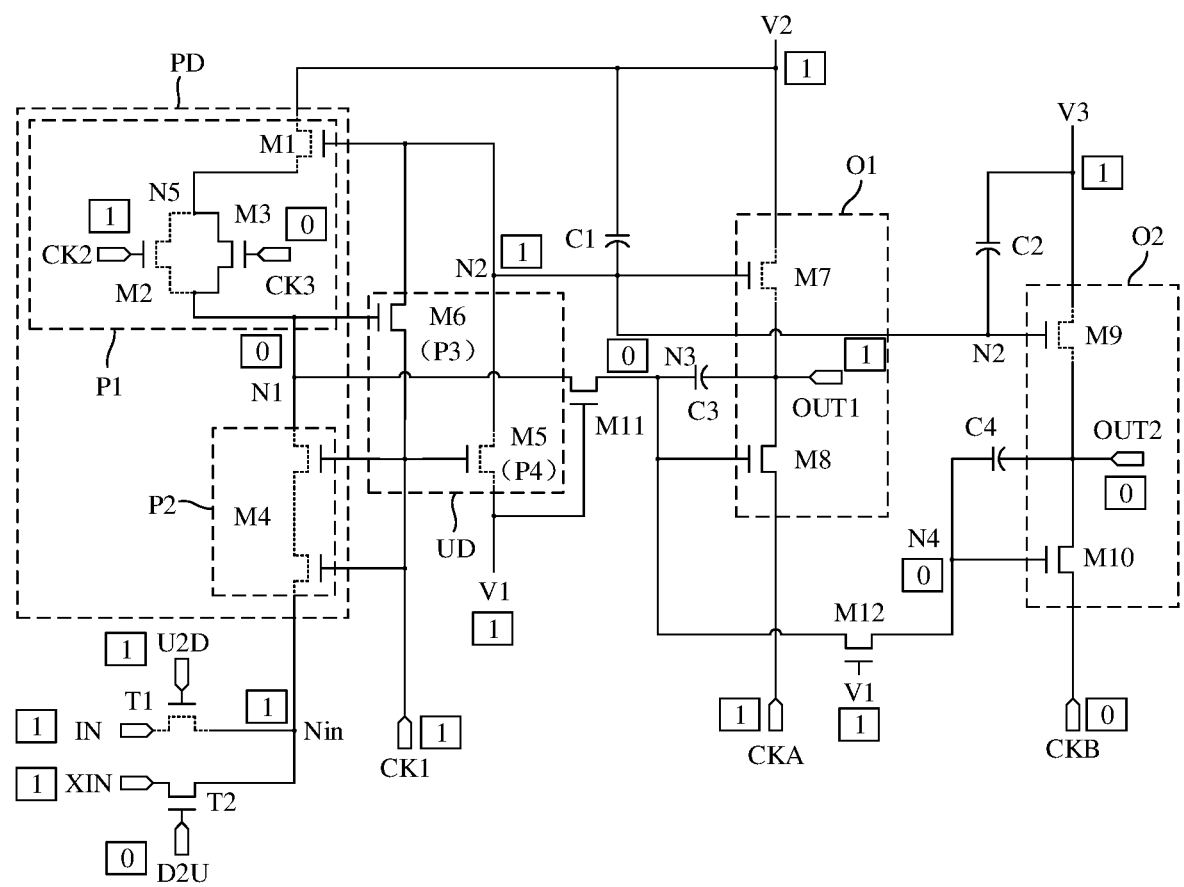
FIG. 21 is a schematic diagram showing a status of a shift register in a t3' period according to an embodiment of the present disclosure.
Figure 22:
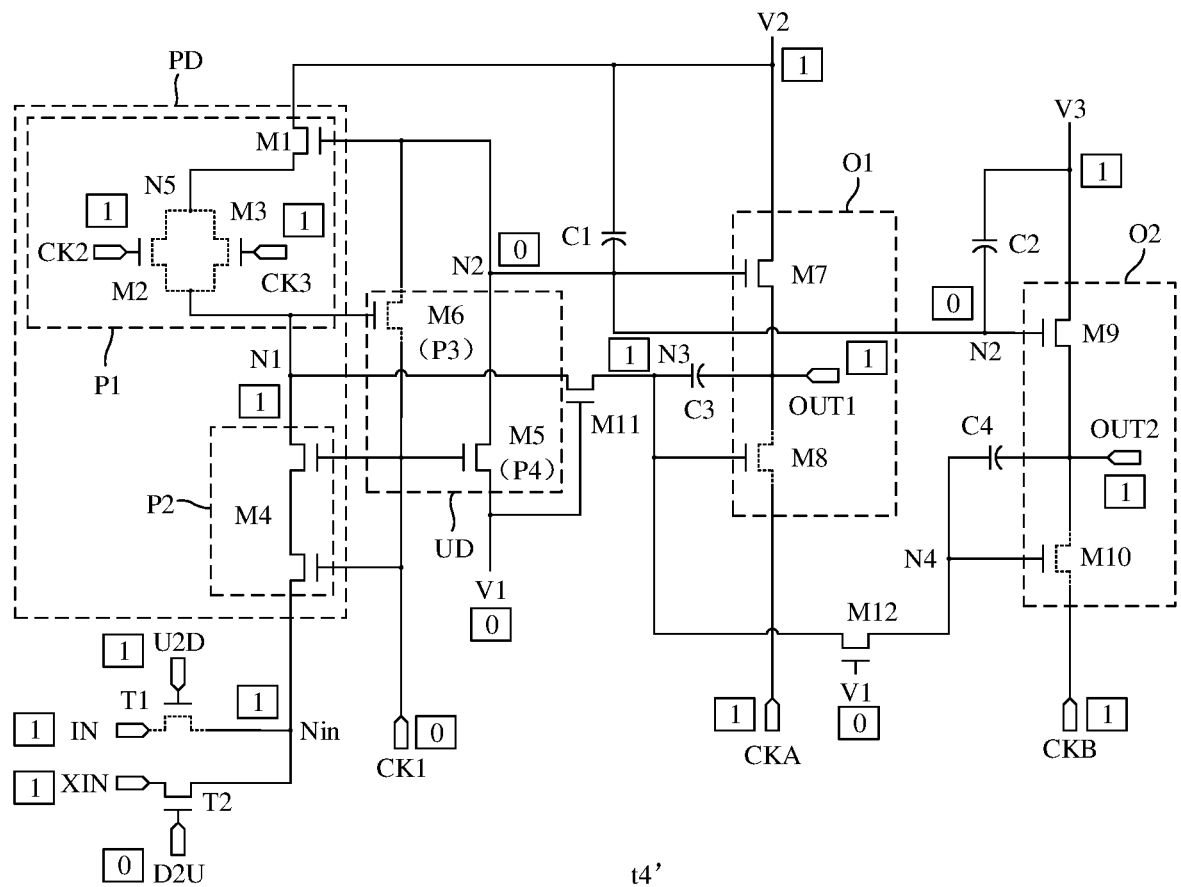
FIG. 22 is a schematic diagram showing a status of a shift register in a t4' period according to an embodiment of the present disclosure.
Figure 23:
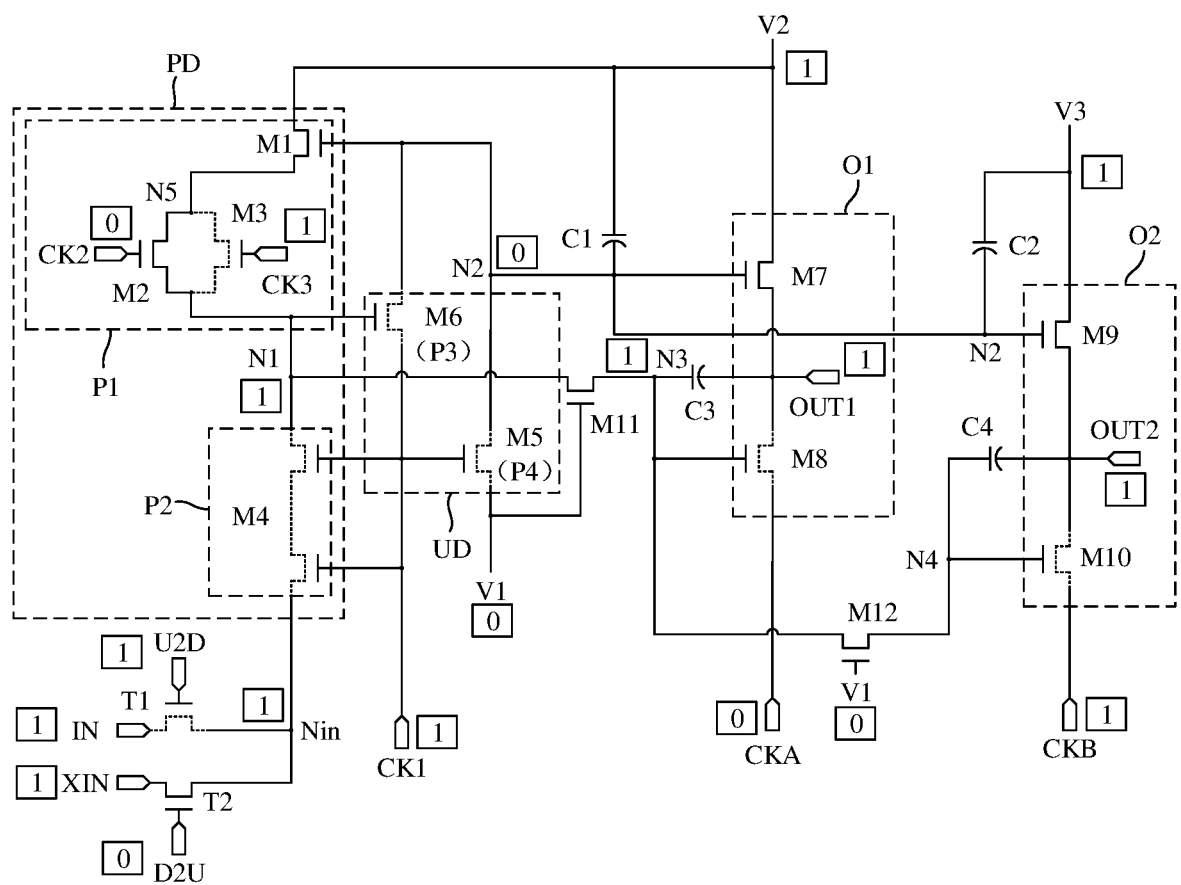
FIG. 23 is a schematic diagram showing a status of a shift register in a t5' period according to an embodiment of the present disclosure.
Figure 24:
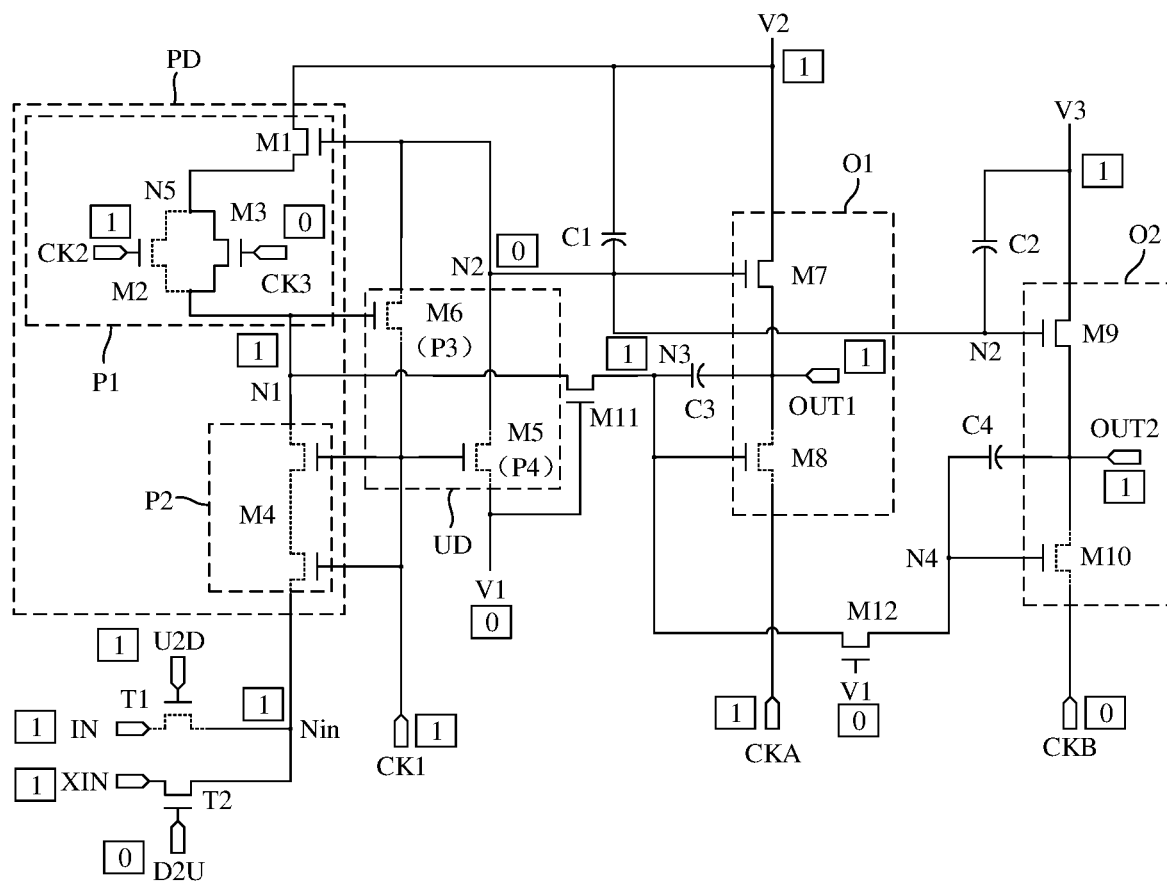
FIG. 24 is a schematic diagram showing a status of a shift register in a t6' period according to an embodiment of the present disclosure.

In an embodiment, as shown in FIG. 18, if the effective level is the low level and the ineffective level is the high level, in the periods of t2 and t3, a potential of the third node N3 is pulled down by a coupling effect on the third capacitor C3 due to a change of a potential of the first output terminal OUT1 from the high level to the low level, and a potential of the fourth node N4 is pulled down by a coupling effect on the fourth capacitor C4 due to a change of a potential of the second output terminal OUT2 from the high level to the low level. A corresponding output circuit is added in the same shift register, both the third capacitor C3 and the fourth capacitor C4 are electrically connected to a same node, and output timings of the first output terminal OUT1 and the second output terminal OUT2 are different, which reduces an effect that the potentials of the third node N3 and the fourth node N4 are pulled down. Therefore, to ensure that the potentials of the third node N3 and the fourth node N4 are pulled down to low enough to ensure the output effect, the low levels in the signals provided by the first to the sixth clock signal output lines (CLKA to CLKF) can be set to be lower than the low level provided by the first supply voltage terminal V1. In this way, even if the potential of the third node N3 is pulled down when the first output terminal OUT1 changes from the high level to the low level, and the potential of the fourth node N4 is pulled down when the second output terminal OUT2 changes from the high level to the low level, the first clock signal output terminal CKA provides a lower potential to the first output terminal OUT1, and the second clock signal output terminal CKB provides a lower potential to the second output terminal OUT2, to ensure that the third node N3 and the fourth node N4 are pulled down to a lower potential in the t2 and t3 periods, the eighth transistor M8 and the tenth transistor M10 are completely turned on, the low level of the first clock signal output terminal CKA is completely output to the first output terminal OUT1, and the low level of the second clock signal output terminal CKB is completely output to the second output terminal OUT2, thereby improving the output stability and the output effect.

In an embodiment, as shown in FIG. 4, FIG. 11, and FIG. 19 to FIG. 24, each scanning cycle of the reverse scanning stage includes a first reverse scanning period t1', a second reverse scanning period t2', the third reverse scanning period t3', a fourth reverse scanning period t4', a fifth reverse scanning period t5', and a sixth reverse scanning period t6' successively. In the reverse scanning stage, the first scanning direction signal line ud1 provides an ineffective level, and the second scanning direction signal line ud2 provides an effective level.

In the first reverse scanning period t1', the third clock signal line CLK3, the first clock signal output line CLKA, and the fourth clock signal output line CLKD each provide an effective level, and the first clock signal line CLK1, the second clock signal line CLK2, the second clock signal output line CLKB, the third clock signal output line CLKC, the fifth clock signal output line CLKE, and the sixth clock signal output line CLKF each provide an ineffective level. In an $(m+2)^{th}$ shift register R, $1 \leq m \leq n-2$, the pull-down unit PD outputs an effective level to the first node N1 based on an effective level provided by the first clock signal terminal CK1, the first node N1 transmits the effective level to the third node N3 and the fourth node N4, the pull-up unit UD outputs an effective level to the second node N2 based on the effective level provided by the first clock signal terminal CK1, and the first output unit O1 and the second output unit O2 output ineffective levels to the first output terminal OUT1 and the second output terminal OUT2 based on the effective levels of the second node N2, the third node N3, and the fourth node N4.

For example, for the $3^{rd}$ shift register R3, an ineffective level provided by the first scanning direction control signal terminal U2D controls turn-off of the first input transistor T1, and an effective level provided by the second scanning direction control signal terminal D2U controls turn-on of the second input transistor T2. The first input terminal IN provides an ineffective level. The second input terminal XIN provides an effective level, and the effective level is transmitted to the input node Nin by using the second input transistor T2 that is turned on. The effective level of the first clock signal terminal CK1 (the third clock signal line CLK3) controls turn-on of the fourth transistor M4 and the fifth transistor M5, in other words, turn-on of the second transmission unit P2 in the pull-down unit PD and the fourth transmission unit P4 in the pull-up unit UD. The second transmission unit P2 (the fourth transistor M4) transmits the effective level of the input node Nin to the first node N1, the first node N1 transmits the effective level to the third node N3, and the third node N3 transmits the effective level to the fourth node N4. The fourth transmission unit P4 (the fifth transistor M5) transmits an effective level of the first supply voltage terminal V1 to the second node N2. The ineffective level provided by the second clock signal terminal CK2 (the second clock signal line CLK2) controls turn-off of the second transistor M2. The ineffective level provided by the third clock signal terminal CK3 (the first clock signal line CLK1) controls turn-off of the third transistor M3. The effective level of the second node N2 controls turn-on of the first transistor M1. In other words, the first transmission unit P1 is turned off. The effective level of the first node N1 controls turn-on of the third transmission unit P3 (the sixth transistor M6), so that the effective level provided by the first clock signal terminal CK1 is transmitted to the second node N2 by using the third transmission unit P3. The effective level of the second node N2 controls turn-on of the seventh transistor M7 and the ninth transistor M9. An ineffective level provided by the second supply voltage terminal V2 is transmitted to the first output terminal OUT1 by using the seventh transistor M7 of the first output unit O1. An ineffective level provided by the third supply voltage terminal V3 is transmitted to the second output terminal OUT2 by using the ninth transistor M9 of the second output unit O2. The effective level of the third node N3 controls turn-on of the eighth transistor M8, so that the ineffective level provided by the first clock signal output terminal CKA (the fifth clock signal output line CLKE) is transmitted to the first output terminal OUT1 by using the eighth transistor M8 of the first output unit O1. The effective level of the fourth node N4 controls turn-on of the tenth transistor M10, so that the ineffective level provided by the second clock signal output terminal CKB (the sixth clock signal output line CLKF) is transmitted to the second output terminal OUT2 by using the tenth transistor M10 of the second output unit O2. It can be learned that, except for the first input transistor T1 and the second input transistor T2, the working process of the $3^{rd}$ shift register R3 in the t1' period is the same as that of the $1^{st}$ shift register R1 in the t1 period.

In the second reverse scanning period t2', the second clock signal line CLK2, the second clock signal output line CLKB, and the fifth clock signal output line CLKE each provide an effective level, and the first clock signal line CLK1, the third clock signal line CLK3, the first clock signal output line CLKA, the third clock signal output line CLKC, the fourth clock signal output line CLKD, and the sixth clock signal output line CLKF each provide an ineffective level. In the $(m+2)^{th}$ shift register R, the pull-down unit PD is turned off, the first node N1 maintains an effective level, the pull-up unit UD transmits, to the second node N2 based on the effective level of the first node N1, the ineffective level provided by the first clock signal terminal CK1, the first output unit O1 transmits an effective level of the first clock signal output terminal CKA to the first output terminal OUT1 based on an effective level of the third node N3 and the ineffective level of the second node N2, and the second output unit O2 transmits an ineffective level of the second clock signal output terminal CKB to the second output terminal OUT2 based on an effective level of the fourth node N4 and the ineffective level of the second node N2.

For example, for the $3^{rd}$ shift register R3, an ineffective level provided by the first scanning direction control signal terminal U2D controls turn-off of the first input transistor T1, and an effective level provided by the second scanning direction control signal terminal D2U controls turn-on of the second input transistor T2. The ineffective level of the first clock signal terminal CK1 (the third clock signal line CLK3) controls turn-off of the fourth transistor M4 and the fifth transistor M5, in other words, turn-off of the second transmission unit P2 in the pull-down unit PD and the fourth transmission unit P4 in the pull-up unit UD. The first node N1 maintains an effective level in a previous period and transmits the effective level to the first node N3, and the third node N3 transmits the effective level to the fourth node N4. The effective level provided by the second clock signal terminal CK2 (the second clock signal line CLK2) controls turn-on of the second transistor M2. The ineffective level provided by the third clock signal terminal CK3 (the first clock signal line CLK1) controls turn-off of the third transistor M3. The effective level of the first node N1 controls turn-on of the third transmission unit P3 (the sixth transistor M6), so that the ineffective level provided by the first clock signal terminal CK1 is transmitted to the second node N2 by using the third transmission unit P3. The ineffective level of the second node N2 controls turn-off of the first transistor M1, in other words, both the first transmission unit P1 and the second transmission unit P2 are turned off. The ineffective level of the second node N2 controls turn-off of the seventh transistor M7 and the ninth transistor M9. The effective level of the third node N3 controls turn-on of the eighth transistor M8, so that the effective level provided by the first clock signal output terminal CKA (the fifth clock signal output line CLKE) is transmitted to the first output terminal OUT1 by using the eighth transistor M8 of the first output unit O1. The effective level of the fourth node N4 controls turn-on of the tenth transistor M10, so that the ineffective level provided by the second clock signal output terminal CKB (the sixth clock signal output line CLKF) is transmitted to the second output terminal OUT2 by using the tenth transistor M10 of the second output unit O2. It can be learned that, except for the first input transistor T1 and the second input transistor T2, the working process of the $3^{rd}$ shift register R3 in the t2' period is the same as that of the $1^{st}$ shift register R1 in the t2 period.

In the third reverse scanning period t3', the first clock signal line CLK1, the third clock signal output line CLKC, and the sixth clock signal output line CLKF each provide an effective level, and the second clock signal line CLK2, the third clock signal line CLK3, the first clock signal output line CLKA, the second clock signal output line CLKB, the fourth clock signal output line CLKD, and the fifth clock signal output line CLKE each provide an ineffective level. In the $(m+2)^{th}$ shift register R, the pull-down unit PD is turned off, the first node N1 maintains an effective level, the pull-up unit UD transmits, to the second node N2 based on the effective level of the first node N1, an ineffective level provided by the first clock signal terminal CK1, the first output unit O1 transmits the ineffective level of the first clock signal output terminal CKA to the first output terminal OUT1 based on an effective level of the third node N3 and the ineffective level of the second node N2, and the second output unit O2 transmits an effective level of the second clock signal output terminal CKB to the second output terminal OUT2 based on an effective level of the fourth node N4 and the ineffective level of the second node N2.

For example, for the $3^{rd}$ shift register R3, an ineffective level provided by the first scanning direction control signal terminal U2D controls turn-off of the first input transistor T1, and an effective level provided by the second scanning direction control signal terminal D2U controls turn-on of the second input transistor T2. The ineffective level of the first clock signal terminal CK1 (the third clock signal line CLK3) controls turn-off of the fourth transistor M4 and the fifth transistor M5, in other words, turn-off of the second transmission unit P2 in the pull-down unit PD and the fourth transmission unit P4 in the pull-up unit UD. The first node N1 maintains an effective level in a previous period and transmits the effective level to the first node N3, and the third node N3 transmits the effective level to the fourth node N4. The ineffective level provided by the second clock signal terminal CK2 (the second clock signal line CLK2) controls turn-off of the second transistor M2. The effective level provided by the third clock signal terminal CK3 (the first clock signal line CLK1) controls turn-on of the third transistor M3. The ineffective level of the second node N2 controls turn-off of the first transistor M1, in other words, both the first transmission unit P1 and the second transmission unit P2 are turned off. The effective level of the first node N1 controls turn-on of the third transmission unit P3 (the sixth transistor M6), so that the ineffective level provided by the first clock signal terminal CK1 is transmitted to the second node N2 by using the third transmission unit P3. The ineffective level of the second node N2 controls turn-off of the seventh transistor M7 and the ninth transistor M9. The effective level of the third node N3 controls turn-on of the eighth transistor M8, so that the ineffective level provided by the first clock signal output terminal CKA (the fifth clock signal output line CLKE) is transmitted to the first output terminal OUT1 by using the eighth transistor M8 of the first output unit O1. The effective level of the fourth node N4 controls turn-on of the tenth transistor M10, so that the effective level provided by the second clock signal output terminal CKB (the sixth clock signal output line CLKF) is transmitted to the second output terminal OUT2 by using the tenth transistor M10 of the second output unit O2. It can be learned that, except for the first input transistor T1 and the second input transistor T2, the working process of the $3^{rd}$ shift register R3 in the t1' period is the same as that of the $1^{st}$ shift register R1 in the t1 period.

In the fourth reverse scanning period t4', the third clock signal line CLK3, the first clock signal output line CLKA, and the fourth clock signal output line CLKD each provide an effective level, and the first clock signal line CLK1, the second clock signal line CLK2, the second clock signal output line CLKB, the third clock signal output line CLKC, the fifth clock signal output line CLKE, and the sixth clock signal output line CLKF each provide an ineffective level. In the $(m+2)^{th}$ shift register R, the pull-down unit PD outputs an ineffective level to the first node N1 based on an effective level provided by the first clock signal terminal CK1, the first node N1 transmits the ineffective level to the third node N3 and the fourth node N4, the pull-up unit UD outputs an effective level to the second node N2 based on the effective level provided by the first clock signal terminal CK1, the first output unit O1 outputs an ineffective level to the first output terminal OUT1 based on the effective level of the second node N2 and the ineffective level of the third node N3, and the second output unit O2 outputs an ineffective level to the second output terminal OUT2 based on the effective level of the second node N2 and the ineffective level of the fourth node N4.

For example, for the $3^{rd}$ shift register R3, an ineffective level provided by the first scanning direction control signal terminal U2D controls turn-off of the first input transistor T1, and an effective level provided by the second scanning direction control signal terminal D2U controls turn-on of the second input transistor T2. The second input terminal XIN provides an ineffective level, and the ineffective level is transmitted to the input node Nin by using the second input transistor T2 that is turned on. The effective level of the first clock signal terminal CK1 (the third clock signal line CLK3) controls turn-on of the fourth transistor M4 and the fifth transistor M5, in other words, turn-on of the second transmission unit P2 in the pull-down unit PD and the fourth transmission unit P4 in the pull-up unit UD. The second transmission unit P2 (the fourth transistor M4) transmits the ineffective level of the input node Nin to the first node N1, the first node N1 transmits the ineffective level to the third node N3, and the third node N3 transmits the ineffective level to the fourth node N4. The fourth transmission unit P4 (the fifth transistor M5) transmits an effective level of the first supply voltage terminal V1 to the second node N2. The ineffective level provided by the second clock signal terminal CK2 (the second clock signal line CLK2) controls turn-off of the second transistor M2. The ineffective level provided by the third clock signal terminal CK3 (the first clock signal line CLK1) controls turn-off of the third transistor M3. The effective level of the second node N2 controls turn-on of the first transistor M1. In other words, the first transmission unit P1 is turned off. The ineffective level of the first node N1 controls turn-off of the third transmission unit P3 (the sixth transistor M6). The effective level of the second node N2 controls turn-on of the seventh transistor M7 and the ninth transistor M9. An ineffective level provided by the second supply voltage terminal V2 is transmitted to the first output terminal OUT1 by using the seventh transistor M7 of the first output unit O1. An ineffective level provided by the third supply voltage terminal V3 is transmitted to the second output terminal OUT2 by using the ninth transistor M9 of the second output unit O2. The ineffective level of the third node N3 controls turn-off of the eighth transistor M8. The effective level of the fourth node N4 controls turn-off of the tenth transistor M10. It can be learned that, except for the first input transistor T1 and the second input transistor T2, the working process of the $3^{rd}$ shift register R3 in the t4' period is the same as that of the $1^{st}$ shift register R1 in the t4 period.

In the fifth reverse scanning period t5', the second clock signal line CLK2, the second clock signal output line CLKB, and the fifth clock signal output line CLKE each provide an effective level, and the first clock signal line CLK1, the third clock signal line CLK3, the first clock signal output line CLKA, the third clock signal output line CLKC, the fourth clock signal output line CLKD, and the sixth clock signal output line CLKF each provide an ineffective level. In the $(m+2)^{th}$ shift register R, the pull-down unit PD transmits an ineffective level of the second supply voltage terminal V2 to the first node N1 based on the effective level of the second clock signal terminal CK2 and an effective level of the second node N2, the first node N1, the third node N3, and the fourth node N4 each maintain an ineffective level, the pull-up unit UD is turned off, the second node N2 maintains the effective level, the first output unit O1 transmits an ineffective level to the first output terminal OUT1 based on the ineffective level of the third node N3 and the effective level of the second node N2, and the second output unit O2 transmits an ineffective level to the second output terminal OUT2 based on the ineffective level of the fourth node N4 and the effective level of the second node N2.

For example, for the $3^{rd}$ shift register R3, an ineffective level provided by the first scanning direction control signal terminal U2D controls turn-off of the first input transistor T1, and an effective level provided by the second scanning direction control signal terminal D2U controls turn-on of the second input transistor T2. The ineffective level of the first clock signal terminal CK1 (the third clock signal line CLK3) controls turn-off of the fourth transistor M4 and the fifth transistor M5, in other words, turn-off of the second transmission unit P2 in the pull-down unit PD and the fourth transmission unit P4 in the pull-up unit UD. The effective level provided by the second clock signal terminal CK2 (the second clock signal line CLK2) controls turn-on of the second transistor M2. An ineffective level provided by the third clock signal terminal CK3 (the second clock signal line CLK2) controls turn-off of the third transistor M3. The second node N2 maintains an effective level in a previous period and controls turn-on of the first transistor M1, in other words, the first transmission unit P1 is turned on and the second transmission unit P2 is turned off. The ineffective level provided by the second supply voltage terminal V2 is transmitted to the first node N1 by using the first transistor M1 and the second transistor M2 of the first transmission unit P1. The ineffective level of the first node N1 controls turn-off of the third transmission unit P3 (the sixth transistor M6). The ineffective level of the first node N1 is transmitted to the third node N3, and the third node N3 transmits the ineffective level to the fourth node N4. The effective level of the second node N2 controls turn-on of the seventh transistor M7, so that the ineffective level of the second supply voltage terminal V2 is transmitted to the first output terminal OUT1 by using the seventh transistor M7 of the first output unit O1. The effective level of the second node N2 controls turn-on of the ninth transistor M9, so that an ineffective level of the third supply voltage terminal V3 is transmitted to the second output terminal OUT2 by using the ninth transistor M9 of the second output unit O2. The ineffective level of the third node N3 controls turn-off of the eighth transistor M8. The ineffective level of the fourth node N4 controls turn-off of the tenth transistor M10. It can be learned that, except for the first input transistor T1 and the second input transistor T2, the working process of the $3^{rd}$ shift register R3 in the t5' period is the same as that of the $1^{st}$ shift register R1 in the t5 period.

In the sixth reverse scanning period t6', the first clock signal line CLK1, the third clock signal output line CLKC, and the sixth clock signal output line CLKF each provide an effective level, and the second clock signal line CLK2, the third clock signal line CLK3, the first clock signal output line CLKA, the second clock signal output line CLKB, the fourth clock signal output line CLKD, and the fifth clock signal output line CLKE each provide an ineffective level. In the $(m+2)^{th}$ shift register R, the pull-down unit PD transmits an ineffective level of the second supply voltage terminal V2 to the first node N1 based on an effective level of the third clock signal terminal CK3 and an effective level of the second node N2, the first node N1, the third node N3, and the fourth node N4 each maintain an ineffective level, the pull-up unit UD is turned off, the second node N2 maintains the effective level, the first output unit O1 transmits an ineffective level to the first output terminal OUT1 based on the ineffective level of the third node N3 and the effective level of the second node N2, and the second output unit O2 transmits an ineffective level to the second output terminal OUT2 based on the ineffective level of the fourth node N4 and the effective level of the second node N2.

For example, for the $3^{rd}$ shift register R3, an ineffective level provided by the first scanning direction control signal terminal U2D controls turn-off of the first input transistor T1, and an effective level provided by the second scanning direction control signal terminal D2U controls turn-on of the second input transistor T2. The ineffective level of the first clock signal terminal CK1 (the third clock signal line CLK3) controls turn-off of the fourth transistor M4 and the fifth transistor M5, in other words, turn-off of the second transmission unit P2 in the pull-down unit PD and the fourth transmission unit P4 in the pull-up unit UD. The ineffective level provided by the second clock signal terminal CK2 (the second clock signal line CLK2) controls turn-off of the second transistor M2. The effective level provided by the third clock signal terminal CK3 (the first clock signal line CLK1) controls turn-on of the third transistor M3. The second node N2 maintains the effective level and controls turn-on of the first transistor M1, the seventh transistor M7, and the ninth transistor M9, so that the ineffective level of the second supply voltage terminal V2 is transmitted to the first output terminal OUT1 by using the seventh transistor M7, and an ineffective level of the third supply voltage terminal V3 is transmitted to the second output terminal OUT2 by using the ninth transistor M9. The ineffective level of the second supply voltage terminal V2 is transmitted to the first node N1 by using the first transistor M1 and the third transistor M3. The first node N1 transmits the ineffective level to the third node N3, and the third node N3 transmits the ineffective level to the fourth node N4. The ineffective level of the first node N1 controls turn-off of the third transmission unit P3 (the sixth transistor M6). The ineffective level of the third node N3 controls turn-off of the eighth transistor M8. The ineffective level of the fourth node N4 controls turn-off of the tenth transistor M10. It can be learned that, except for the first input transistor T1 and the second input transistor T2, the working process of the $3^{rd}$ shift register R3 in the t6' period is the same as that of the $1^{st}$ shift register R1 in the t6 period.

For the $3^{rd}$ shift register R3, the effective level of the second input terminal XIN is shifted in the t1', t2', and t3' periods. The first output terminal OUT1 transmits the shifted effective level to the $2^{nd}$ shift register R2 as an input signal of a previous shift register R2. The $3^{rd}$ shift register R3 maintains output of the ineffective level in the t4', t5', and t6' periods. Specifically, the $3^{rd}$ shift register R3 repeats the control processes in the t4', t5', and t6' periods before an effective level of the input terminal arrives next time, to maintain output of the ineffective level. Other shift registers have the same control processes. Different shift registers shift an effective level of an input signal from a next shift register at different time, to realize reverse scan, to be specific, to provide an effective level to the reset scan line in each row successively from back to front, and provide an effective level to the data writing scan line in each row successively from back to front. In addition, for the reset scan line and the data writing scan line in a same row, an effective level of the reset scan line is before an effective level of the data writing scan line, to drive screen refreshing from back to front.

As shown in FIG. 10 and FIG. 11, it can be learned that, at the forward scanning stage and the reserve scanning stage, the timings of the first clock signal line CLK1 and the second clock signal line CLK2 are exchanged, the timings of the first clock signal output line CKLA and the fifth clock signal output line CLKE are exchanged, and the timings of the second clock signal output line CLKB and the sixth clock signal output line CLKF are exchanged. In the driving process, only the timing of each clock signal and the timings of the first scanning direction signal line ud1 and the second scanning direction signal line ud2 can be changed to realize switching between the forward scanning and the reverse scanning. In other words, the forward scanning and the reverse scanning of the pixel drive circuit can be driven only by using a same scanning drive circuit, to ensure driving control of the pixel drive circuit.

Figure 25:
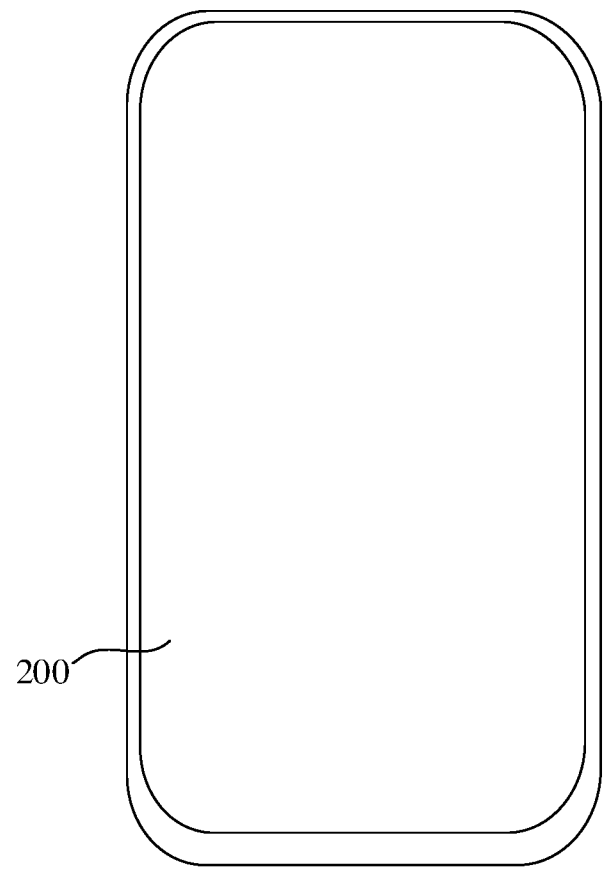
FIG. 25 is a schematic diagram of a display apparatus according to an embodiment of the present disclosure.

As shown in FIG. 25, an embodiment of the present disclosure further provides a display apparatus, including the above display panel 200. The structure and the principle of the display panel 200 are the same as those in the above embodiments, which is not described herein again. The display apparatus can be, for example, any electronic device having a display function, such as a touch screen, a mobile phone, a tablet computer, a notebook computer, or a television.

The above descriptions are merely some embodiments of the present disclosure and are not intended to limit the present disclosure. Any modification, equivalent replacement and improvement within the principle of the present disclosure shall be included within the protection scope of the present disclosure.

Finally, it should be noted that the foregoing embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the scope of the technical solutions of the embodiments of the present disclosure.

What is claimed is:

1. A scanning drive circuit, comprising:
   n shift registers that are cascaded sequentially, wherein the n shift registers comprise a $1^{st}$ shift register to an $n^{th}$ shift register,
   wherein each of the n shift registers comprises:
   an input node;
   a first node;
   a second node;
   a third node, wherein the first node is electrically connected to the third node;
   a fourth node, wherein the third node is electrically connected to the fourth node;
   a first output terminal;
   a second output terminal;
   a pull-down unit, wherein the pull-down unit is electrically connected to the first node and the input node, and is configured to provide a level to the first node under control of a first clock signal and a second clock signal;
   a pull-up unit, wherein the pull-up unit is electrically connected to the second node and a first supply voltage terminal, and is configured to provide a level to the second node under control of the first clock signal;
   a first output unit, wherein the first output unit is electrically connected to a second supply voltage terminal and a first clock signal output terminal, and is configured to output a level to the first output terminal based on a level of the second node and a level of the third node; and
   a second output unit, wherein the second output unit is electrically connected to a third supply voltage terminal and a second clock signal output terminal, and is configured to output a level to the second output terminal based on the level of the second node and a level of the fourth node,
   wherein in one scanning cycle of the scanning drive circuit, the first output terminal and the second output terminal of each of the n shift registers output an effective level sequentially;
   wherein the scanning drive circuit further comprises:
   a first clock signal line, a second clock signal line, a third clock signal line, a first clock signal output line, a second clock signal output line, a third clock signal output line, a fourth clock signal output line, a fifth clock signal output line, a sixth clock signal output line, a first scanning direction signal line, and a second scanning direction signal line,
   wherein each of the n shift registers further comprises: a first clock signal terminal configured to provide the first clock signal, a second clock signal terminal configured to provide the second clock signal, and a third clock signal terminal configured to provide a third clock signal;
   wherein in a $(3i-2)^{th}$ shift register of the n shift registers, the first clock signal terminal is electrically connected to the first clock signal line, the second clock signal terminal is electrically connected to the second clock signal line, the third clock signal terminal is electrically connected to the third clock signal line, the first clock signal output terminal is electrically connected to the first clock signal output line, and the second clock signal output terminal is electrically connected to the second clock signal output line,
   in a $(3i-1)^{th}$ shift register of the n shift registers, the first clock signal terminal is electrically connected to the second clock signal line, the second clock signal terminal is electrically connected to the third clock signal line, the third clock signal terminal is electrically connected to the first clock signal line, the first clock signal output terminal is electrically connected to the third clock signal output line, and the second clock signal output terminal is electrically connected to the fourth clock signal output line, and
   in a $3i^{th}$ shift register of the n shift registers, the first clock signal terminal is electrically connected to the third clock signal line, the second clock signal terminal is electrically connected to the first clock signal line, the third clock signal terminal is electrically connected to the second clock signal line, the first clock signal output terminal is electrically connected to the fifth clock signal output line, and the second clock signal output terminal is electrically connected to the sixth clock signal output line, where i=1, 2, 3, . . . , and n; and
   wherein in each of the n shift registers, a first scanning direction control signal terminal is electrically connected to the first scanning direction signal line, and a second scanning direction control signal terminal is electrically connected to the second scanning direction signal line.

2. The scanning drive circuit according to claim 1, wherein each of the n shift registers further comprises:
   a first input terminal, a second input terminal, a first scanning direction control signal terminal, and a second scanning direction control signal terminal;

a first input transistor connected in series between the first input terminal and the input node, wherein a control terminal of the first input transistor is electrically connected to the first scanning direction control signal terminal; and
a second input transistor connected in series between the second input terminal and the input node, wherein a control terminal of the second input transistor is electrically connected to the second scanning direction control signal terminal,
wherein in a $j^{th}$ shift register of the n shift registers, the first input terminal is electrically connected to the first output terminal of a $(j-1)^{th}$ shift register of the n shift registers, where j=2, 3, ..., and n; and
wherein in a $k^{th}$ shift register of the n shift registers, the second input terminal is electrically connected to the first output terminal of a $(k+1)^{th}$ shift register of the n shift registers, where k=1, 2, 3, ..., and n−1.

3. The scanning drive circuit according to claim 1, wherein each of the n shift registers further comprises:
a fifth node, a first clock signal terminal, and a second clock signal terminal, wherein the first clock signal terminal is configured to provide the first clock signal, and the second clock signal terminal is configured to provide the second clock signal; and
wherein the pull-down unit comprises:
a first transmission unit, wherein the first transmission unit is connected in series between the second supply voltage terminal and the first node, and is configured to transmit a level to the first node based on the level of the second node and the second clock signal; and
a second transmission unit, wherein the second transmission unit is connected in series between the first node and the input node, and is configured to transmit a level to the first node based on the first clock signal.

4. The scanning drive circuit according to claim 3, wherein each of the n shift registers further comprises a third clock signal terminal configured to provide a third clock signal;
wherein the first transmission unit comprises:
a first transistor connected in series between the second supply voltage terminal and the fifth node, wherein a control terminal of the first transistor is electrically connected to the second node;
a second transistor connected in series between the fifth node and the first node, wherein a control terminal of the second transistor is electrically connected to the second clock signal terminal; and
a third transistor connected in parallel with the second transistor, wherein a control terminal of the third transistor is electrically connected to the third clock signal terminal; and
wherein the second transmission unit comprises:
a fourth transistor connected in series between the first node and the input node, wherein a control terminal of the fourth transistor is electrically connected to the first clock signal terminal.

5. The scanning drive circuit according to claim 4, wherein the fourth transistor is a dual-gate transistor.

6. The scanning drive circuit according to claim 1, wherein each of the n shift registers further comprises a first clock signal terminal configured to provide the first clock signal; and
wherein the pull-up unit comprises:
a third transmission unit connected in series between the second node and the first clock signal terminal; and
the fourth transmission unit, wherein the fourth transmission unit is connected in series between the second node and the first supply voltage terminal and is configured to transmit a level to the second node based on the first clock signal, and the third transmission unit is configured to transmit a level to the second node based on a level of the first node.

7. The scanning drive circuit according to claim 6, wherein the fourth transmission unit comprises a fifth transistor connected in series between the second node and the first supply voltage terminal, wherein a control terminal of the fifth transistor is electrically connected to the first clock signal terminal; and
wherein the third transmission unit comprises a sixth transistor connected in series between the second node and the first clock signal terminal, and wherein a control terminal of the sixth transistor is electrically connected to the first node.

8. The scanning drive circuit according to claim 1, wherein the first output unit comprises:
a seventh transistor connected in series between the second supply voltage terminal and the first output terminal, wherein a control terminal of the seventh transistor is electrically connected to the second node; and
an eighth transistor connected in series between the first output terminal and the first clock signal output terminal, wherein a control terminal of the eighth transistor is electrically connected to the third node; and
wherein the second output unit comprises:
a ninth transistor connected in series between the third supply voltage terminal and the second output terminal, wherein a control terminal of the ninth transistor is electrically connected to the second node; and
a tenth transistor connected in series between the second output terminal and the second clock signal output terminal, wherein a control terminal of the tenth transistor is electrically connected to the fourth node.

9. The scanning drive circuit according to claim 8, wherein each of the n shift registers further comprises:
a first capacitor connected in series between the second supply voltage terminal and the second node.

10. The scanning drive circuit according to claim 8, wherein each of the n shift registers further comprises a second capacitor connected in series between the third supply voltage terminal and the second node;
wherein a distance between the first capacitor and the seventh transistor is smaller than a distance between the first capacitor and the ninth transistor; and
wherein a distance between the second capacitor and the seventh transistor is greater than a distance between the second capacitor and the ninth transistor.

11. The scanning drive circuit according to claim 8, wherein each of the n shift registers further comprises:
a third capacitor connected in series between the third node and the first output terminal; and
a fourth capacitor connected in series between the fourth node and the second output terminal.

12. The scanning drive circuit according to claim 8, wherein each of the n shift registers further comprises an eleventh transistor, wherein the first node is electrically connected to the third node through the eleventh transistor, and a control terminal of the eleventh transistor is electrically connected to the first supply voltage terminal; or
each of the n shift registers further comprises a twelfth transistor, wherein the third node is electrically connected to the fourth node through the twelfth transistor, and a control terminal of the twelfth transistor is electrically connected to the first supply voltage terminal.

13. The scanning drive circuit according to claim 1, wherein the effective level is a low level, an ineffective level is a high level, the first supply voltage terminal is configured to provide the low level, the second supply voltage terminal is configured to provide the high level, and the third supply voltage terminal is configured to provide the high level; and
 a low level of a signal provided by the first clock signal output line, a low level of a signal provided by the second clock signal output line, a low level of a signal provided by the third clock signal output line, a low level of a signal provided by the fourth clock signal output line, a low level of a signal provided by the fifth clock signal output line, and a low level of a signal provided by the sixth clock signal output line are lower than a low level provided by the first supply voltage terminal.

14. A driving method for the scanning drive circuit according to claim 1, wherein the scanning drive circuit is configured to operate at a forward scanning stage or a reverse scanning stage;
 each scanning cycle of the forward scanning stage comprises a first forward scanning period, a second forward scanning period, and a third forward scanning period that arranged in a sequence;
 in the first forward scanning period, the second forward scanning period, and the third forward scanning period, the first clock signal line, the second clock signal line, and the third clock signal line provide an effective level sequentially; and
 in the first forward scanning period, the second forward scanning period, and the third forward scanning period, a signal line group defined by the fourth clock signal output line and the fifth clock signal output line, a signal line group defined by the first clock signal output line and the sixth clock signal output line, and a signal line group defined by the second clock signal output line and the third clock signal output line provide an effective level sequentially.

15. The driving method according to claim 14, wherein each scanning cycle of the reverse scanning stage comprises a first reverse scanning period, a second reverse scanning period, and a third reverse scanning period that are arranged in a sequence;
 in the first reverse scanning period, the second reverse scanning period, and the third reverse scanning period, the third clock signal line, the second clock signal line, and the first clock signal line provide an effective level sequentially; and
 in the first reverse scanning period, the second reverse scanning period, and the third reverse scanning period, a signal line group defined by the first clock signal output line and the fourth clock signal output line, a signal line group defined by the second clock signal output line and the fifth clock signal output line, and a signal line group defined by the third clock signal output line and the sixth clock signal output line provide an effective level sequentially.

16. The driving method according to claim 14, wherein each scanning cycle of the forward scanning stage further comprises a fourth forward scanning period, a fifth forward scanning period, and a sixth forward scanning period, wherein the first forward scanning period, the second forward scanning period, the third forward scanning period, the fourth forward scanning period, the fifth forward scanning period, and the sixth forward scanning period are arranged in a sequence;
 in the first forward scanning period, the first clock signal line, the fourth clock signal output line, and the fifth clock signal output line each provide an effective level, and the second clock signal line, the third clock signal line, the first clock signal output line, the second clock signal output line, the third clock signal output line, and the sixth clock signal output line each provide an ineffective level; and in an $m^{th}$ shift register of the n shift registers, $1 \le m \le n-2$, the pull-down unit outputs an effective level to the first node based on an effective level provided by the first clock signal terminal, the first node transmits an effective level to the third node and the fourth node, the pull-up unit outputs an effective level to the second node based on the effective level provided by the first clock signal terminal, and the first output unit and the second output unit output ineffective levels to the first output terminal and the second output terminal based on the effective level of the second node, the effective level of the third node, and the effective level of the fourth node;
 in the second forward scanning period, the second clock signal line, the first clock signal output line, and the sixth clock signal output line each provide an effective level, and the first clock signal line, the third clock signal line, the second clock signal output line, the third clock signal output line, the fourth clock signal output line, and the fifth clock signal output line each provide an ineffective level; and in the $m^{th}$ shift register, the pull-down unit is turned off, the first node maintains the effective level output by the pull-down unit in the first forward scanning period, the pull-up unit transmits an ineffective level provided by the first clock signal terminal to the second node based on the effective level of the first node, the first output unit transmits an effective level of the first clock signal output terminal to the first output terminal based on an effective level of the third node and an ineffective level of the second node, and the second output unit transmits an ineffective level of the second clock signal output terminal to the second output terminal based on the effective level of the fourth node and the ineffective level of the second node;
 in the third forward scanning period, the third clock signal line, the second clock signal output line, and the third clock signal output line each provide an effective level, and the first clock signal line, the second clock signal line, the first clock signal output line, the fourth clock signal output line, the fifth clock signal output line, and the sixth clock signal output line each provide an ineffective level; and in the $m^{th}$ shift register, the pull-down unit is turned off, the first node maintains the effective level output by the pull-down unit in the first forward scanning period, the pull-up unit transmits the ineffective level provided by the first clock signal terminal to the second node based on the effective level of the first node, the first output unit transmits an ineffective level of the first clock signal output terminal to the first output terminal based on the effective level of the third node and the ineffective level of the second node, and the second output unit transmits an effective level of the second clock signal output terminal to the second output terminal based on the effective level of the fourth node and the ineffective level of the second node;

in the fourth forward scanning period, the first clock signal line, the fourth clock signal output line, and the fifth clock signal output line each provide an effective level, and the second clock signal line, the third clock signal line, the first clock signal output line, the second clock signal output line, the third clock signal output line, and the sixth clock signal output line each provide an ineffective level; and in the $m^{th}$ shift register, the pull-down unit outputs an ineffective level to the first node based on the effective level provided by the first clock signal terminal, the first node transmits an ineffective level to the third node and the fourth node, the pull-up unit outputs an effective level to the second node based on the effective level provided by the first clock signal terminal, the first output unit outputs an ineffective level to the first output terminal based on the effective level of the second node and the ineffective level of the third node, and the second output unit outputs an ineffective level to the second output terminal based on the effective level of the second node and the ineffective level of the fourth node;

in the fifth forward scanning period, the second clock signal line, the first clock signal output line, and the sixth clock signal output line each provide an effective level, and the first clock signal line, the third clock signal line, the second clock signal output line, the third clock signal output line, the fourth clock signal output line, and the fifth clock signal output line each provide an ineffective level; and in the $m^{th}$ shift register, the pull-down unit transmits an ineffective level of the second supply voltage terminal to the first node based on an effective level of the second clock signal terminal and the effective level of the second node, the first node, the third node, and the fourth node each maintain an ineffective level, the pull-up unit is turned off, the second node maintains the effective level, the first output unit transmits the ineffective level to the first output terminal based on the ineffective level of the third node and the effective level of the second node, and the second output unit transmits an ineffective level to the second output terminal based on the ineffective level of the fourth node and the effective level of the second node; and in the sixth forward scanning period, the third clock signal line, the second clock signal output line, and the third clock signal output line each provide an effective level, and the first clock signal line, the second clock signal line, the first clock signal output line, the fourth clock signal output line, the fifth clock signal output line, and the sixth clock signal output line each provide an ineffective level; and in the $m^{th}$ shift register, the pull-down unit transmits the ineffective level of the second supply voltage terminal to the first node based on an effective level of the third clock signal terminal and the effective level of the second node, the first node, the third node, and the fourth node each maintain an ineffective level, the pull-up unit is turned off, the second node maintains the effective level, the first output unit transmits an ineffective level to the first output terminal based on the ineffective level of the third node and the effective level of the second node, and the second output unit transmits an ineffective level to the second output terminal based on the ineffective level of the fourth node and the effective level of the second node.

17. The driving method according to claim 16, wherein each scanning cycle of the reverse scanning stage further comprises a fourth reverse scanning period, a fifth reverse scanning period, and a sixth reverse scanning period, wherein the first reverse scanning period, the second reverse scanning period, the third reverse scanning period, the fourth reverse scanning period, the fifth reverse scanning period, and the sixth reverse scanning period are arranged in a sequence;

in the first reverse scanning period, the third clock signal line, the first clock signal output line, and the fourth clock signal output line each provide an effective level, and the first clock signal line, the second clock signal line, the second clock signal output line, the third clock signal output line, the fifth clock signal output line, and the sixth clock signal output line each provide an ineffective level; and in an $(m+2)^{th}$ shift register of the n shift registers, $1 \le m \le n-2$, the pull-down unit outputs an effective level to the first node based on an effective level provided by the first clock signal terminal, the first node transmits its effective level to the third node and the fourth node, the pull-up unit outputs an effective level to the second node based on the effective level provided by the first clock signal terminal, and the first output unit and the second output unit output ineffective levels to the first output terminal and the second output terminal based on the effective level of the second node, the effective level of the third node, and the effective level of the fourth node;

in the second reverse scanning period, the second clock signal line, the second clock signal output line, and the fifth clock signal output line each provide an effective level, and the first clock signal line, the third clock signal line, the first clock signal output line, the third clock signal output line, the fourth clock signal output line, and the sixth clock signal output line each provide an ineffective level; and in the $(m+2)^{th}$ shift register, the pull-down unit is turned off, the first node maintains the effective level output by the pull-down unit in the first reverse scanning period, the pull-up unit transmits an ineffective level provided by the first clock signal terminal to the second node based on the effective level of the first node, the first output unit transmits the effective level of the first clock signal output terminal to the first output terminal based on the effective level of the third node and the ineffective level of the second node, and the second output unit transmits an ineffective level of the second clock signal output terminal to the second output terminal based on the effective level of the fourth node and the ineffective level of the second node;

in the third reverse scanning period, the first clock signal line, the third clock signal output line, and the sixth clock signal output line each provide an effective level, and the second clock signal line, the third clock signal line, the first clock signal output line, the second clock signal output line, the fourth clock signal output line, and the fifth clock signal output line each provide an ineffective level; and in the $(m+2)^{th}$ shift register, the pull-down unit is turned off, the first node maintains the effective level, the pull-up unit transmits the ineffective level provided by the first clock signal terminal to the second node based on the effective level of the first node, the first output unit transmits the ineffective level of the first clock signal output terminal to the first output terminal based on the effective level of the third node and the ineffective level of the second node, and the second output unit transmits an effective level of the second clock signal output terminal to the second output terminal based on the effective level of the fourth node and the ineffective level of the second node;

in the fourth reverse scanning period, the third clock signal line, the first clock signal output line, and the fourth clock signal output line each provide an effective level, and the first clock signal line, the second clock signal line, the second clock signal output line, the third clock signal output line, the fifth clock signal output line, and the sixth clock signal output line each provide an ineffective level; and in the (m+2)$^{th}$ shift register, the pull-down unit outputs an ineffective level to the first node based on an effective level provided by the first clock signal terminal, the first node transmits the ineffective level to the third node and the fourth node, the pull-up unit outputs an effective level to the second node based on the effective level provided by the first clock signal terminal, the first output unit outputs an ineffective level to the first output terminal based on the effective level of the second node and the ineffective level of the third node, and the second output unit outputs an ineffective level to the second output terminal based on the effective level of the second node and the ineffective level of the fourth node;

in the fifth reverse scanning period, the second clock signal line, the second clock signal output line, and the fifth clock signal output line each provide an effective level, and the first clock signal line, the third clock signal line, the first clock signal output line, the third clock signal output line, the fourth clock signal output line, and the sixth clock signal output line each provide an ineffective level; and in the (m+2)$^{th}$ shift register, the pull-down unit transmits an ineffective level of the second supply voltage terminal to the first node based on the effective level of the second clock signal terminal and the effective level of the second node, the first node, the third node, and the fourth node each maintain an ineffective level, the pull-up unit is turned off, the second node maintains the effective level, the first output unit transmits an ineffective level to the first output terminal based on the ineffective level of the third node and the effective level of the second node, and the second output unit transmits an ineffective level to the second output terminal based on the ineffective level of the fourth node and the effective level of the second node; and in the sixth reverse scanning period, the first clock signal line, the third clock signal output line, and the sixth clock signal output line each provide an effective level, and the second clock signal line, the third clock signal line, the first clock signal output line, the second clock signal output line, the fourth clock signal output line, and the fifth clock signal output line each provide an ineffective level; and in the (m+2)$^{th}$ shift register, the pull-down unit transmits the ineffective level of the second supply voltage terminal to the first node based on an effective level of the third clock signal terminal and the effective level of the second node, the first node, the third node, and the fourth node each maintain an ineffective level, the pull-up unit is turned off, the second node maintains the effective level, the first output unit transmits an ineffective level to the first output terminal based on the ineffective level of the third node and the effective level of the second node, and the second output unit transmits an ineffective level to the second output terminal based on the ineffective level of the fourth node and the effective level of the second node.

18. A driving method for a scanning drive circuit, wherein the scanning drive circuit comprises n shift registers that are cascaded sequentially, wherein the n shift registers comprise a 1$^{st}$ shift register to an n$^{th}$ shift register, and each of the n shift registers comprises an input node, a first node, a second node, a third node electrically connected to the first node, a fourth node electrically connected to the third node, a first output terminal, a second output terminal, a pull-down unit, a pull-up unit, a first output unit, and a second output unit; wherein the pull-down unit is electrically connected to the first node and the input node and is configured to provide a level to the first node under control of a first clock signal and a second clock signal, the pull-up unit is electrically connected to the second node and a first supply voltage terminal and is configured to provide a level to the second node under control of the first clock signal, the first output unit is electrically connected to a second supply voltage terminal and a first clock signal output terminal and is configured to output a level to the first output terminal based on a level of the second node and a level of the third node, and the second output unit is electrically connected to a third supply voltage terminal and a second clock signal output terminal and is configured to output a level to the second output terminal based on the level of the second node and a level of the fourth node, and in one scanning cycle of the scanning drive circuit, the first output terminal and the second output terminal of each of the n shift registers output an effective level sequentially;

wherein the scanning drive circuit further comprises:
a first clock signal line, a second clock signal line, a third clock signal line, a first clock signal output line, a second clock signal output line, a third clock signal output line, a fourth clock signal output line, a fifth clock signal output line, a sixth clock signal output line, a first scanning direction signal line, and a second scanning direction signal line, wherein each of the n shift registers further comprises: a first clock signal terminal configured to provide the first clock signal, a second clock signal terminal configured to provide the second clock signal, and a third clock signal terminal configured to provide a third clock signal;

wherein in a (3i−2)$^{th}$ shift register of the n shift registers, the first clock signal terminal is electrically connected to the first clock signal line, the second clock signal terminal is electrically connected to the second clock signal line, the third clock signal terminal is electrically connected to the third clock signal line, the first clock signal output terminal is electrically connected to the first clock signal output line, and the second clock signal output terminal is electrically connected to the second clock signal output line, in a (3i−1)$^{th}$ shift register of the n shift registers, the first clock signal terminal is electrically connected to the second clock signal line, the second clock signal terminal is electrically connected to the third clock signal line, the third clock signal terminal is electrically connected to the first clock signal line, the first clock signal output terminal is electrically connected to the third clock signal output line, and the second clock signal output terminal is electrically connected to the fourth clock signal output line, and in a 3i$^{th}$ shift register of the n shift registers, the first clock signal terminal is electrically connected to the third clock signal line, the second clock signal terminal is electrically connected to the first clock signal line, the third clock signal terminal is electrically connected to the second clock signal line, the first clock signal output terminal is electrically connected to the fifth clock signal output line, and the second clock signal output terminal is electrically connected to the sixth clock signal output line, where i=1, 2, 3, . . . , and n;

wherein in each of the n shift registers, a first scanning direction control signal terminal is electrically connected to the first scanning direction signal line, and a second scanning direction control signal terminal is electrically connected to the second scanning direction signal line;

wherein the scanning drive circuit is configured to operate at a forward scanning stage or a reverse scanning stage;

in each scanning cycle of the forward scanning stage, first output terminals of the $1^{st}$ shift register to the $n^{th}$ shift register output effective levels sequentially in an order of 1 to n, and the first output terminal and the second output terminal of each of the n shift registers output effective levels sequentially; and in each scanning cycle of the reverse scanning stage, the first output terminals of the n shift registers output effective levels sequentially in an order of n to 1, and the first output terminal and the second output terminal of each of the n shift registers output effective levels successively.

19. A display panel, comprising:

a scanning drive circuit; and n rows of pixel drive circuits, and the n rows of pixel drive circuits comprise $1^{st}$-row of pixel drive circuits to $n^{th}$-row of pixel drive circuits, wherein each row of the n rows of pixel drive circuits comprises pixel drive circuits, and each of the pixel drive circuits comprises a reset circuit and a data writing circuit;

wherein the scanning drive circuit comprises n shift registers that are cascaded sequentially, wherein the n shift registers comprise a $1^{st}$ shift register to an $n^{th}$ shift register, wherein each of the n shift registers comprises:
an input node;
a first node;
a second node;
a third node, wherein the first node is electrically connected to the third node;
a fourth node, wherein the third node is electrically connected to the fourth node;
a first output terminal;
a second output terminal;
a pull-down unit, wherein the pull-down unit is electrically connected to the first node and the input node, and is configured to provide a level to the first node under control of a first clock signal and a second clock signal;
a pull-up unit, wherein the pull-up unit is electrically connected to the second node and a first supply voltage terminal, and is configured to provide a level to the second node under control of the first clock signal;
a first output unit, wherein the first output unit is electrically connected to a second supply voltage terminal and a first clock signal output terminal, and is configured to output a level to the first output terminal based on a level of the second node and a level of the third node; and a second output unit, wherein the second output unit is electrically connected to a third supply voltage terminal and a second clock signal output terminal, and is configured to output a level to the second output terminal based on the level of the second node and a level of the fourth node, wherein in one scanning cycle of the scanning drive circuit, the first output terminal and the second output terminal of each of the n shift registers output an effective level sequentially;

wherein the scanning drive circuit further comprises:

a first clock signal line, a second clock signal line, a third clock signal line, a first clock signal output line, a second clock signal output line, a third clock signal output line, a fourth clock signal output line, a fifth clock signal output line, a sixth clock signal output line, a first scanning direction signal line, and a second scanning direction signal line, wherein each of the n shift registers further comprises: a first clock signal terminal configured to provide the first clock signal, a second clock signal terminal configured to provide the second clock signal, and a third clock signal terminal configured to provide a third clock signal;

wherein in a $(3i-2)^{th}$ shift register of the n shift registers, the first clock signal terminal is electrically connected to the first clock signal line, the second clock signal terminal is electrically connected to the second clock signal line, the third clock signal terminal is electrically connected to the third clock signal line, the first clock signal output terminal is electrically connected to the first clock signal output line, and the second clock signal output terminal is electrically connected to the second clock signal output line, in a $(3i-1)^{th}$ shift register of the n shift registers, the first clock signal terminal is electrically connected to the second clock signal line, the second clock signal terminal is electrically connected to the third clock signal line, the third clock signal terminal is electrically connected to the first clock signal line, the first clock signal output terminal is electrically connected to the third clock signal output line, and the second clock signal output terminal is electrically connected to the fourth clock signal output line, and in a $3i^{th}$ shift register of the n shift registers, the first clock signal terminal is electrically connected to the third clock signal line, the second clock signal terminal is electrically connected to the first clock signal line, the third clock signal terminal is electrically connected to the second clock signal line, the first clock signal output terminal is electrically connected to the fifth clock signal output line, and the second clock signal output terminal is electrically connected to the sixth clock signal output line, where i=1, 2, 3, . . . , and n; and wherein in each of the n shift registers, a first scanning direction control signal terminal is electrically connected to the first scanning direction signal line, and a second scanning direction control signal terminal is electrically connected to the second scanning direction signal line; and wherein the reset circuits of the pixel drive circuits in a $q^{th}$-row of pixel drive circuits of the n rows of pixel drive circuits are electrically connected to the first output terminal of a $q^{th}$ shift register of the n shift registers, and each are configured to control, based on an effective level of the first output terminal of the $q^{th}$ shift register, the pixel drive circuits in the $q^{th}$-row of pixel drive circuits to enter a reset stage; the data writing circuits in the $q^{th}$-row of pixel drive circuits are electrically connected to the second output terminal of the $q^{th}$ shift register, and each are configured to control, based on an effective level of the second output terminal of the $q^{th}$ shift register, the pixel drive circuits in the $q^{th}$-row of pixel drive circuits to enter a data writing stage; and in one of at least one scanning cycle of the scanning drive circuit, the reset stage of the $q^{th}$ shift register is prior to the data writing stage, where q=1, 2, 3, . . . , and n.

* * * * *